(12) United States Patent
Ito et al.

(10) Patent No.: US 9,350,346 B2
(45) Date of Patent: May 24, 2016

(54) SWITCH DEVICE

(75) Inventors: Hiroyoshi Ito, Toyota (JP); Hiroya Ando, Toyota (JP); Norio Abe, Toki (JP); Nobuyuki Nakagawa, Miyoshi (JP); Yusuke Satoh, Toyota (JP)

(73) Assignee: TOYOTA JIDOSHA KABUSHIKI KAISHA, Toyota-Shi (JP)

( * ) Notice: Subject to any disclaimer, the term of this patent is extended or adjusted under 35 U.S.C. 154(b) by 974 days.

(21) Appl. No.: 13/508,727

(22) PCT Filed: Nov. 18, 2009

(86) PCT No.: PCT/JP2009/069556
§ 371 (c)(1),
(2), (4) Date: May 8, 2012

(87) PCT Pub. No.: WO2011/061823
PCT Pub. Date: May 26, 2011

(65) Prior Publication Data
US 2012/0228961 A1   Sep. 13, 2012

(51) Int. Cl.
*G01R 23/15* (2006.01)
*H03K 17/965* (2006.01)

(52) U.S. Cl.
CPC ........ *H03K 17/965* (2013.01); *H03K 2217/958* (2013.01); *H03K 2217/96011* (2013.01)

(58) Field of Classification Search
CPC .......... H01H 36/00; H01H 15/02; G06F 3/02; G06K 17/00; H04B 13/00
USPC ........................................................... 307/1
See application file for complete search history.

(56) References Cited

U.S. PATENT DOCUMENTS

2005/0234778 A1* 10/2005 Sperduti et al. .................. 705/22
2005/0242957 A1* 11/2005 Lindsay et al. ............ 340/572.7
2006/0071787 A1*  4/2006 Hoepken et al. ......... 340/539.23

(Continued)

FOREIGN PATENT DOCUMENTS

DE         10348884 A1   5/2005
EP         1638206 A2    3/2006

(Continued)

OTHER PUBLICATIONS

International Search Report Mailed Dec. 15, 2009 of PCT/JP2009/069556.

*Primary Examiner* — Thienvu Tran
*Assistant Examiner* — David M Stables
(74) *Attorney, Agent, or Firm* — Kenyon & Kenyon LLP

(57) ABSTRACT

There are: a communication sheet that propagates electromagnetic wave; a wireless communication part arranged close to the communication sheet, and stores predetermined information, and wirelessly transmits the predetermined information to the communication sheet; a shield part that shields a radio signal wirelessly transmitted from the wireless communication part; an operation part that enables or disables wireless communication between the communication sheet and the wireless communication part; and a discrimination part that discriminates contents of operation by the operation part based on the predetermined information wirelessly transmitted by the wireless communication part. According to an operation by said operation part to disable the wireless communication between said communication sheet and the wireless communication part, said shield part shields the radio signal from the wireless communication part.

10 Claims, 15 Drawing Sheets

(56) References Cited

U.S. PATENT DOCUMENTS

| | | | | |
|---|---|---|---|---|
| 2006/0214515 A1* | 9/2006 | Pullmann | ............ | H03K 17/9502 307/326 |
| 2007/0152829 A1* | 7/2007 | Lindsay et al. | ............ | 340/572.3 |
| 2008/0119135 A1* | 5/2008 | Washiro | ............ | H04B 5/0012 455/41.1 |
| 2009/0058420 A1* | 3/2009 | Adachi et al. | ................. | 324/322 |
| 2009/0179822 A1* | 7/2009 | Shinoda et al. | ............... | 343/897 |

FOREIGN PATENT DOCUMENTS

| | | |
|---|---|---|
| JP | 2002-190728 A | 7/2002 |
| JP | 2004-216981 A | 8/2004 |
| JP | 2005-151094 A | 6/2005 |
| JP | 2006-058997 A | 3/2006 |
| JP | 2007-060712 A | 3/2007 |
| JP | 2007150652 A | 6/2007 |
| JP | 2008-059190 A | 3/2008 |
| JP | 2009-213295 A | 9/2009 |

* cited by examiner

SWITCH DEVICE

This is a 371 national phase application of PCT/JP2009/069556 filed 18 Nov. 2009, the contents of which are incorporated herein by reference.

TECHNICAL FIELD

The present invention relates to a switch device.

BACKGROUND ART

A switch device is used, for example, for opening and closing of an electric circuit. The switch device used for opening and closing of an electric circuit may be referred to as an opening/closing device. For example, a switch device is configured by a movable contact terminal (referred to as a movable contact point) and a fixed contact terminal (referred to as a fixed contact point), and a circuit is formed by the movable contact terminal being moved to contact a contact surface of the movable contact terminal with a contact surface of the fixed contact terminal and a current flows. The state of the current flowing is referred to as a state of close. A state where a current does not flow in the circuit is set by an operation of moving the movable contact terminal to separate the contact surface of the movable terminal from the contact surface of the fixed contact terminal. The state where a current does not flow is referred to as a state of open. The movable contact terminal is constructed to maintain the state of open or close, and the state does not change if some vibration is given.

There are the following devices as an example of a device to which a switch device is applied.

For example, a certain remote-control device (part 1) includes a wireless IC tag. The remote-control device receives a radio frequency from a device main body by turning a switch ON. A power supply voltage is generated in the wireless IC tag by the radio frequency received, which enables transmission of data stored. For example, the switch is turned ON by moving the movable contact terminal so that the contact surface of the movable contact terminal makes contact with the contact surface of the fixed contact terminal.

Moreover, for example, a certain remote-control device (part 2) includes a wireless IC tag. The remote-control device has a contact type switch in a part of an electric circuit constituting an antenna of the wiress IC tag. The remote-control device causes an antenna characteristic to change by ON/OFF of the switch. By the characteristic of the antenna being changed, a detection device having a radio frequency tranceiver function detects presence or absence of a response signal from the wireless IC tag, and outputs a detection signal based on the presence or absence of the response signal. A predetermned device operates based on the detection signal output from the detection device.

There is a non-contact type switch other than the above-mentioned contact type switch having the movable contact part and the fixed contact part.

For example, a certain remote-control device (part 3) has a detection device provided with a radio frequency transceiver function and an operation part having a function to return a response signal based on a radio frequency signal transitted from the detection device. The operation part includes a wireless tag. The operation part is provided in a movable open/close member that opens and closes an opening part of an accomodation device. An detection antenna connected to the detection device to perform transmission and reception of radio frequency between the operation part is provided in the vicinity of the opening part in the accommodation device, and a switch for activating or inactivating the signal transmission function of the radio tag is provided in the operation part. A predetermined device is caused to be operated based on the detection signal which the detection device outputs by detecting a presence of a response signal from the radio tag.

Moreover, a certain non-contact short distance communication device (part 4) has a first communication unit to which a first antenna is connected and a second communication unit to which a second antenna is connected. The first and second communication units perform non-contact sort distance communication according to an electromagnetic coupling formed by the first and second antennas. It has an operation means for supplying an operation instruction signal to the second communication unit, and the second antenna and the second communication unit are incorporated in a case. The case is provided at an arbitrary position with respect to the first antenna so that an electromagnetism coupling is formed by the first and second antennas. For example, the first antenna is arranged in an instrument panel.

PRIOR ART DOCUMENT

Patent Document

Patent Document 1: Japanese Laid-Open Patent Application No. 2002-190728
Patent Document 2: Japanese Laid-Open Patent Application No. 2007-60712
Patent Document 3: Japanese Laid-Open patent Application No. 2005-151094
Patent Document 4: Japanese Laid-Open Patent Application No. 2004-216981

SUMMARY OF THE INVENTION

Problems to be Solved by the Invention

In the remote-control device (part 1), because switching ON or OFF of the switch is performed by electrical contact points, there may be a problem caused by contact failure of the contact points.

In the remote-control device (part 2), because switching ON or OFF of the switch is performed by electrical contact points, there may be a problem caused by contact failure of the contact points. Further, because the switch device and the wireless IC tag are separated from each other, a wiring board and/or wires are needed to connect the switch device and the wireless IC tag. Because a wiring board and/or wires are needed, it is possible to raise a cost. Additionally, when a malfunction occurs in a mode where the wireless IC tag cannot perform communications, the response signal is not transmitted from the wireless IC tag even if the switch is switched ON or OFF. When a malfunction occurs in a mode where the wireless IC tag cannot perform communications, it cannot discriminate whether the switch is malfunctioning or the wireless IC tag is malfunctioning.

In the remote-control device (part 3), a communicable distance between the detection antenna and the wireless tag varies depending on variations in characteristics of the detection antenna and the wireless tag, a state of a power supply, a temperature, etc. Because the communicable distance varies, a sufficient distance is needed between the detection antenna and the wireless tag in order to surely switch ON/OFF based on the distance. The distance may also be referred to as a stroke. Because a sufficient stroke is needed, it is possible that the switch becomes a large size. Additionally, when a malfunction occurs in a mode where the wireless tag cannot perform communications, the detection signal cannot be detected because the detection device cannot receive the response signal from the wireless tag. When a malfunction occurs in a mode where the wireless tag cannot perform communications, it cannot be determined whether the wireless tag is malfunctioning or the switch is malfunctioning.

In the non-contact short distance communication device (part 4), the communicable distance between the first communication unit and the second communication unit varies depending on variations in characteristics of the first and second communication units, a state of a power supply, a temperature, etc. Because the communicable distance varies, a sufficient distance is needed between the first antenna and the second antenna in order to surely switch ON/OFF based on the distance. The distance may also be referred to as a stroke. Because a sufficient stroke is needed, it is possible that the device becomes a large size. Additionally, when a malfunction occurs in a mode where the first or second communication unit cannot perform communications, it cannot be determined whether the antennas are malfunctioning or the communication units are malfunctioning.

The present invention was made in consideration of the above-mentioned points, and it is an object to provide a non-contact point type switch device which can shorten a stroke for switching ON or OFF.

Means to Solve the Problems

The switch device comprising:
a communication sheet that propagates electromagnetic wave;
a wireless communication part arranged close to said communication sheet, and stores predetermined information, and wirelessly transmits said predetermined information to the communication sheet;
a shield part that shields a radio signal wirelessly transmitted from said wireless communication part;
an operation part that enables or disables wireless communication between said communication sheet and said wireless communication part; and
a discrimination part that discriminates contents of operation by said operation part based on the predetermined information wirelessly transmitted by said wireless communication part,
wherein said shield part is arranged between said communication sheet and said wireless communication part; and
according to an operation by said operation part to disable the wireless communication between said communication sheet and said wireless communication part, said shield part, said communication sheet or said wireless communication part slides and shields the radio signal from said wireless communication part.

The switch device comprising:
a communication sheet that propagates electromagnetic wave;
a plurality of wireless communication parts arranged close to said communication sheet, and stores predetermined information, and wirelessly transmits said predetermined information to the communication sheet;
a shield part that shields a radio signal wirelessly transmitted from said wireless communication parts;
an operation part that enables wireless communication between said communication sheet and any one of said plurality of wireless communication parts; and
a discrimination part that discriminates contents of operation by said operation part based on the predetermined information wirelessly transmitted by said wireless communication parts,
wherein
each wireless communication part stores unique information;
said shield part is arranged between said communication sheet and said plurality of wireless communication parts; and
according to an operation by said operation part to disable the wireless communication between said communication sheet and other wireless communication parts other than the wireless communication part that should be set to be wirelessly communicable, said shield part, said communication sheet or said wireless communication part slides and shields the radio signal from said other wireless communication parts.

The switch device comprising:
a communication sheet that propagates electromagnetic wave;
a plurality of wireless communication parts arranged close to said communication sheet, and stores predetermined information, and wirelessly transmits said predetermined information to the communication sheet;
a shield part that shields a radio signal wirelessly transmitted from said wireless communication parts;
an operation part that enables wireless communication between said communication sheet and at least one of said plurality of wireless communication parts; and
a discrimination part that discriminates contents of operation by said operation part based on the predetermined information wirelessly transmitted by said wireless communication parts,
wherein each wireless communication part stores unique information;
said shield part is arranged between said communication sheet and said wireless communication part; and
according to an operation by said operation part to disable the wireless communication between said communication sheet and other wireless communication parts other than the wireless communication part that should be set to be wirelessly communicable, said shield part, said communication sheet or said wireless communication part slides and shields the radio signal from said other wireless communication parts.

Effect of the Invention

According to the disclosed switch device, a non-contact point type switch device, which can shorten a stroke for switching ON or OFF, can be realized.

MODE FOR CARRYING OUT THE INVENTION

Figure 1:
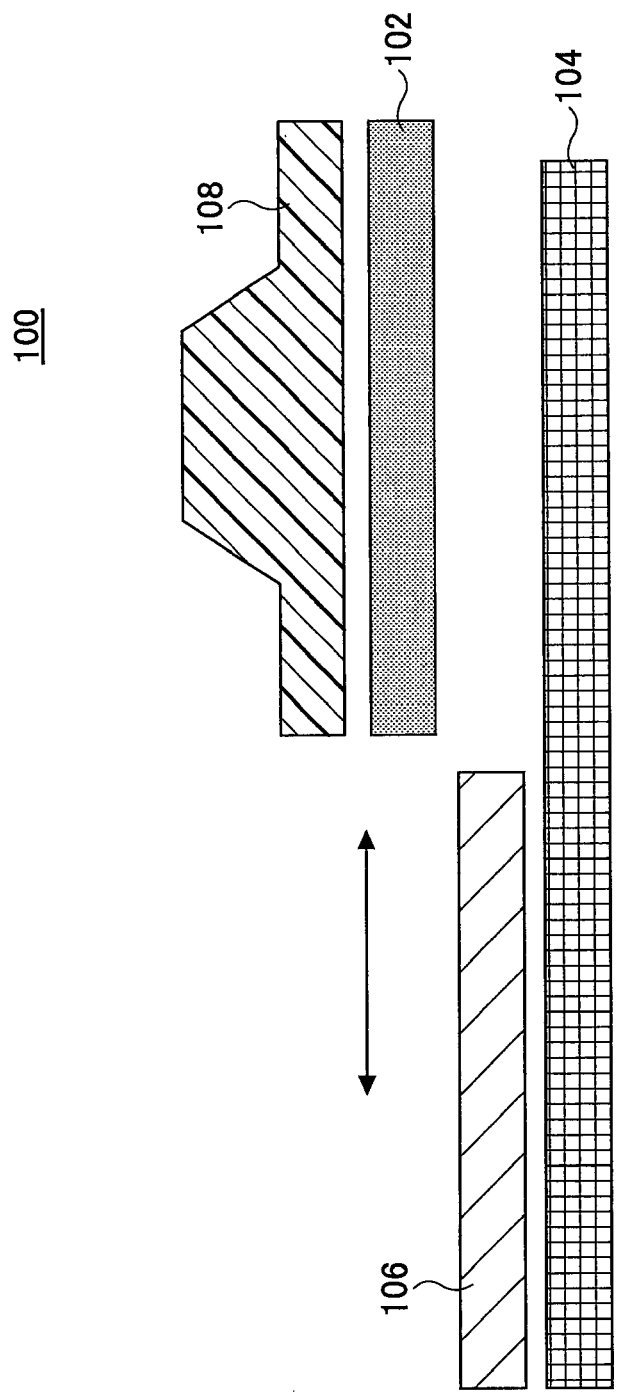
FIG. 1 is a structure diagram of an example of a switch device according to an embodiment.

A description will now be given, with reference to the drawings, of modes for carrying out the present invention based on the following embodiments.

It should be noted that in all drawings for explaining the embodiments, parts having the same function are given the same reference numerals, and repeated descriptions will be omitted.

<First Embodiment>
<Switch Device>

FIG. 1 illustrates a switch device according to the present embodiment.

The switch device applies a 2-dimensional communication technology. The 2-dimensional communication technology uses an electromagnetic wave propagating along a surface of a thin sheet or an object. Hereafter, one along which an electromagnetic wave propagates according to the 2-dimensional communication is referred to as "2-dimensional communication sheet". No wirings exist in the 2-dimensional plane of the 2-dimensional communication sheet, and when a sensor node approaches an arbitrary position on the sheet surface, the sensor node is connected to a network. This is because electromagnetic energy is confined in the vicinity of the surface. An operation electric power of the sensor is supplied through the 2-dimensional surface. Because a signal space which does not interfere with a radio frequency in the space is formed in the 2-dimensional surface, many sensors can be high-speed connected without an interference with a radio frequency. The power consumption for the communication is smaller than a case of a radio frequency communication because a propagation range is within the 2-dimensional surface.

In the present embodiment, a switch device that switches ON or OFF by a slide operation is illustrated as an example of a switch mechanism. Although mentioned later, it can be applied to a switch device having other mechanisms. Moreover, although a wireless IC tag is explained as an example of the sensor node in the present embodiment, it can be widely applied to IC chips that are communicable by a radio frequency.

The switch device 100 has a wireless IC tag 102, a 2-dimensional communication sheet 104, a shield board 106, and an operation part 108. In FIG. 1, a cross-sectional view of the switch device is illustrated. Although it is illustrated that the 2-dimensional communication sheet 104 and the shield board 106 are separated form each other and the wireless IC tag 102 and the operation part 108 are separated from each other in FIG. 1, they are in contact with each other. In FIG. 1, an arrow indicates a direction of sliding the operation part 108.

The shield board 106 is formed in a part of a primary surface of the 2-dimensional communication sheet 104. Hereinafter, an area in which the shield board 106 is formed on the primary surface of the 2-dimensional communication sheet 104 is referred to as "incommunicable area", and an area other than "incommunicable area" is referred to as "communicable area". The shield board 106 shields the communication between the 2-dimensional communication sheet 104 and the wireless IC tag 102. Moreover, the shield board 106 blocks off the power supply from the 2-dimensional communication sheet 104 to the wireless IC tag 102. Accordingly, if the shield board 106 is located between the 2-dimensional communication sheet 104 and the wireless IC tag 102, no electric power is supplied from the 2-dimensional communication sheet 104 to the wireless IC tag 102, and no communication can be performed between the 2-dimensional communication sheet 104 and the wireless IC tag 102. The shield board 106 is not limited to a board if it has a function to block off the communication between the 2-dimensional communication sheet 104 and the wireless IC tag 102 and electric power supply from the 2-dimensional communication sheet 104 to the wireless IC tag 102. The wireless IC tag 102 is slidably provided between the incommunicable area and the communicable area on the opposite side of the 2-dimensional communication sheet 104 with respect to the shield board 106.

The wireless IC tag 102 is constituted by an IC chip and an antenna in viewpoint of hardware. Radio-communication functions and ID information to be sent are stored in the IC chip. The antenna is used for communications and also used for supplying electric poser to the IC chip. The electric power for operating the IC chip is supplied from the 2-dimensional communication sheet 104 through the antenna. Electric power is supplied to the 2-dimensional communication sheet 104 from a power supply part (not illustrated in the figure). An electromotive force is generated by the antenna entering the electromagnetic field generated by the 2-dimensional communication sheet 104, which results in a voltage being applied to the IC chip. A frequency used for the wireless IC tag may be either a 13.56 MHz band or a 2.45 GHz band. The 13.56 MHz band is a frequency band assigned to a wireless card system, and a 2.45 GHz band is an ISM band used for wireless LAN, etc. In the wireless IC tag 102, a communicable distance varies depending on a frequency used because electric power is supplied from a radio frequency received by an antenna. Because there also is a difference in supplying electric power, a reachable distance is about 80 cm at maximum when the 13.65 MHz band is used, and is about 1.5 m at maximum when the 2.45 GHz band is used. Further, if a free space in a UHF band, for example, 950 to 956 MHz, is assigned to a wireless IC tag, the frequency concerned may be used. The operation part is formed on the opposite side of the shield board 106 with respect to the wireless IC tag 102. The operation part 108 has a function to slide the wireless IC tag 108.

In the switch device 100, the wireless IC tag 102 connected to the operation part 108 is also slid between the incommunicable area and the communicable area by causing the operation part 108 to slide between the incommunicable area and the communicable area. By the wireless IC tag 102 being slid between the incommunicable area and the communicable area, electric power is not supplied from the 2-dimensional communication sheet 104 to the wireless IC tag 102 and the communication between the 2-dimensional communication sheet 104 and the wireless IC tag 102 is blocked off when the wireless IC tag 102 is located in the incommunicable area, and, thereby the communication between the wireless IC tag 102 and the 2-dimensional communication sheet 104 cannot be achieved. Additionally, when the wireless IC tag 102 is located in the communicable area, electric power is supplied from the 2-dimensional communication sheet 104 to the wireless IC tag 102, and, thereby, the communication between the wireless IC tag 102 and the 2-dimensional communication sheet 104 can be achieved. In FIG. 1, because the wireless IC tag 102 slides to the left by sliding the operation part 108 to the left and the shield board 106 is positioned between the wireless IC tag 102 and the 2-dimensional communication sheet 104, the communication between the wireless IC tag 102 and the 2-dimensional communication sheet 104 cannot be achieved.

According to the present embodiment, a state where the wireless IC tag 102 is communicable or a state where the wireless IC tag is not communicable can be set by performing an operation to cause the operation part 108 to slide between the incommunicable area and the communicable area. The switch can be realized by having a function to set the state where the wireless IC tag 102 is communicable and the state where the wireless IC tag 102 is not communicable to correspond to ON or OFF, and further detect the state where the wireless IC tag 102 can communicate and the state where the wireless IC tag 102 cannot communicate in order to discriminate ON or OFF in accordance with the detection results.

Furthermore, the wireless IC tag is in a size as large as about several centimeters. Therefore, because it can switch ON or OFF by causing the operation part 108 to slide about several centimeters, the stroke can be shortened. The shape of the wireless IC tag 102 can be of a label type, a card type, a coin type, a stick type, etc., and any one can be used. Moreover, although the communicable distance may be about several millimeters to several meters, and can be selected in response to the size of the switch 100 if necessary.

<Variation (Part 1)>

Although the example in which the operation part 108 and the wireless IC tag 102 slide simultaneously in the above-mentioned embodiment, it is not limited to this example.

Figure 2:
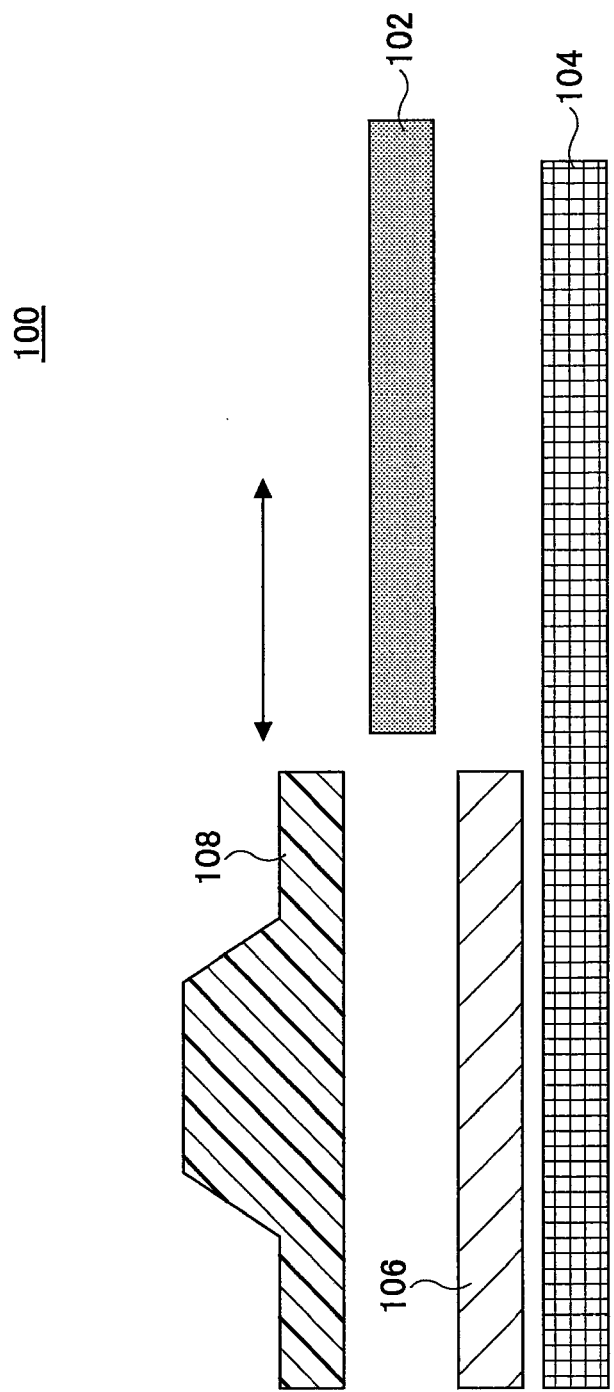
FIG. 2 is a structure diagram of an example of a switch device according to an embodiment.

FIG. 2 illustrates the switch device 100 according to the present variation.

The switch device 100 is configured to make the operation part 108 and the shield board 106 to slide simultaneously in the switch device that has been explained with reference to FIG. 1. A cross-sectional view of the switch device is illustrated in FIG. 2. Although it is illustrated in FIG. 2 that the 2-dimensional communication sheet 104 and the shield board 106 are separated from each other and the wireless IC tag 102 and the operation part 108 are separated from each other, they are in contact with each other. In FIG. 2, an arrow indicates a direction to slide the operation part 108. In FIG. 2, because the wireless IC tag 102 is located in the communicable area, the wireless IC tag 102 and the 2-dimensional communication sheet 104 can communicate with each other. In FIG. 2, the communication between the wireless IC tag 102 and the 2-dimensional communication sheet 104 is disabled by causing the operation part 108 to slide to the right because the shield board 106 also slides to the right to be located between the wireless IC tag 102 and the 2-dimensional communication sheet 104.

According to the present variation, by performing the operation to cause the operation part 108 to slide, the shield board 106 slides, which enables to set the state where the wireless IC tag 102 can communicate or the state where it cannot communicate. The switch can be realized by having a function to set the state where the wireless IC tag 102 can communicate and the state where the wireless IC tag 102 cannot communicate to correspond to ON or OFF, and further detect the state where the wireless IC tag 102 can communicate or cannot communicate in order to discriminate ON or OFF in accordance with the detection results.

<Variation (Part 2)>

Although the example in which the operation part 108 and the wireless IC tag 102 slide simultaneously in the above-mentioned embodiment, it is not limited to this example.

Figure 3:
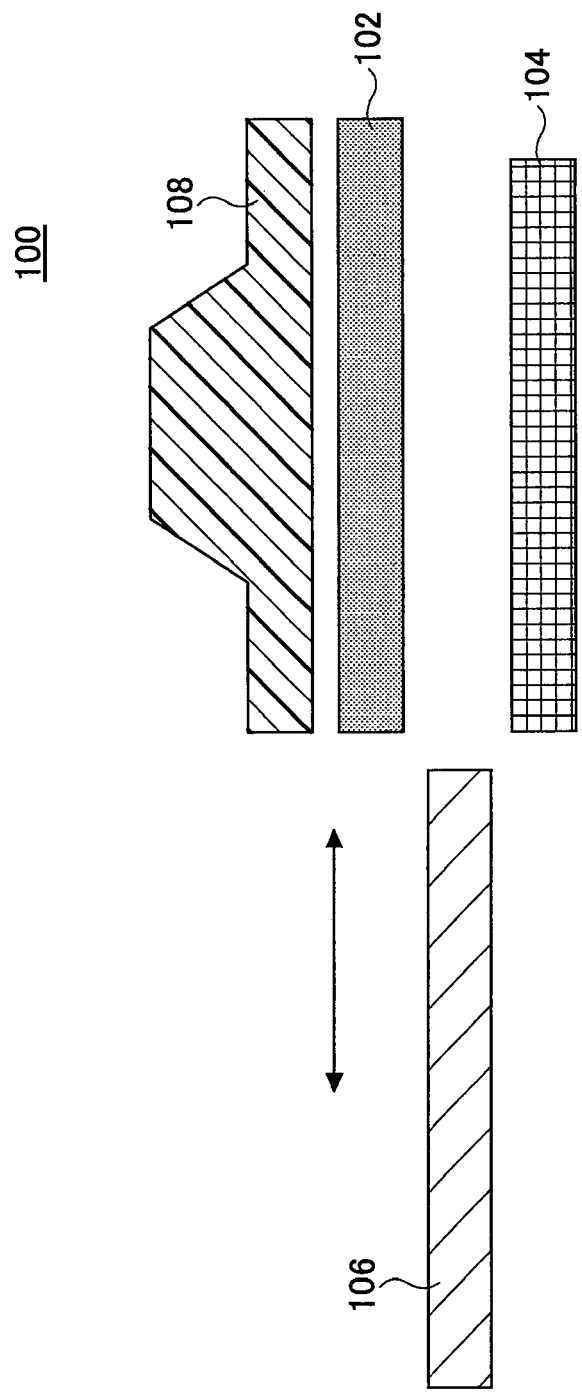
FIG. 3 is a structure diagram of an example of a switch device according to an embodiment.

FIG. 3 illustrates the switch device 100 according to the present variation.

The switch device 100 is configured to make the operation part 108 and the 2-dimensional communication sheet 104 to slide simultaneously in the switch device that has been explained with reference to FIG. 1. A cross-sectional view of the switch device is illustrated in FIG. 3. Although it is illustrated in FIG. 3 that the 2-dimensional communication sheet 104 and the shield board 106 are separated from each other and the wireless IC tag 102 and the operation part 108 are separated from each other, they are in contact with each other. In FIG. 3, an arrow indicates a direction to slide the operation part 108. In FIG. 3, because the wireless IC tag 102 is located in the communicable area, the wireless IC tag 102 and the 2-dimensional communication sheet 104 can communicate with each other. In FIG. 3, the communication between the wireless IC tag 102 and the 2-dimensional communication sheet 104 is disabled by causing the operation part 108 to slide to the left because the shield board 106 also slides to the left to be located between the wireless IC tag 102 and the 2-dimensional communication sheet 104.

In the switch device 100, the shield board 106 is not always necessary. Because there may be a case where the electromagnetic wave used to supply electric power from the 2-dimensional communication sheet 104 to the wireless IC tag 102 has certain expansion spatially, it is desirable to have the shield board 106 in a view point of completely preventing the power supply by the electromagnetic wave when the operation part 108 is caused to slide to the left. Additionally, because there may be a case where the communication wave between the 2-dimensional communication sheet 104 and the wireless IC tag 102 has certain expansion spatially, it is desirable to have the shield board 106 in a view point of completely preventing the communication between the 2-dimensional communication sheet 104 and the wireless IC tag 102 when the operation part 108 is caused to slide to the left.

According to the present variation, by performing the operation to cause the operation part 108 to slide between the incommunicable area and the communicable area, the 2-dimensional communication sheet 104 slides, which enables to set the state where the wireless IC tag 102 can communicate or the state where it cannot communicate. The switch can be realized by having a function to set the state where the wireless IC tag 102 can communicate and the state where the wireless IC tag 102 cannot communicate to correspond to ON or OFF, and further detect the state where the wireless IC tag 102 can communicate or cannot communicate in order to discriminate ON or OFF in accordance with the detection results.

<Second Embodiment>
<Switch Device>

Figure 4:
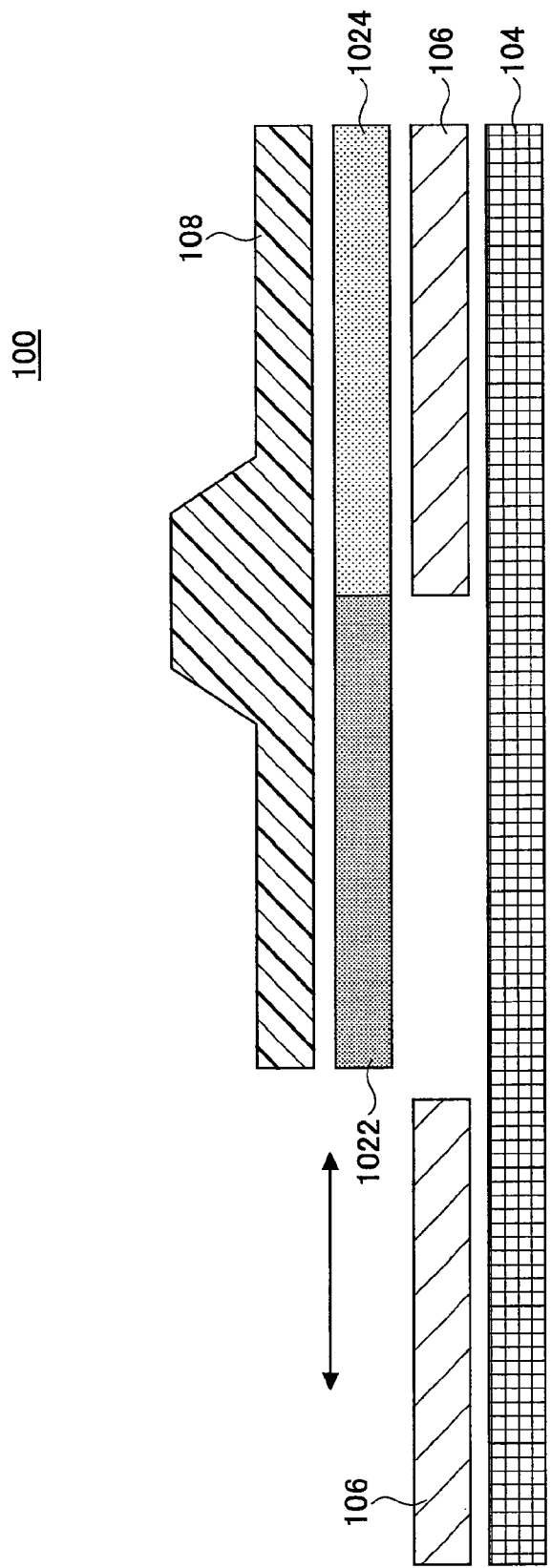
FIG. 4 is a structure diagram of an example of a switch device according to an embodiment.

FIG. 4 illustrates a switch device according to the present embodiment. The switch device applies a 2-dimensional communication technology. In this regard, it is the same as that of the embodiment mentioned above. In the present embodiment, the same as the above-mentioned embodiment, a switch device that switches ON or OFF by a slide operation is illustrated as an example of a switch mechanism. Although mentioned later, it can be applied to a switch device having other mechanisms. Moreover, although a wireless IC tag is explained as an example of a sensor node in the present embodiment, it can be widely applied to IC chips that are communicable by a radio frequency.

The switch device 100 has wireless IC tags 1022 and 1024, the 2-dimensional communication sheet 104, the shield board 106, and the operation part 108. In FIG. 4, a cross-sectional view of the switch device is illustrated. Although it is illustrated that the 2-dimensional communication sheet 104 and the shield board 106 are separated form each other and the wireless IC tags 1022 and 1024 and the operation part 108 are separated from each other in FIG. 4, they are in contact with each other. In FIG. 4, an arrow indicates a direction of sliding the operation part 108.

The shield board 106 is formed in a part of a primary surface of the 2-dimensional communication sheet 104. Hereinafter, an area in which the shield board 106 is formed on the primary surface of the 2-dimensional communication sheet 104 is referred to as "incommunicable area", and an area other than "incommunicable area" is referred to as "communicable area". The wireless IC tags 1022 and 1024 are formed adjacent to each other on an opposite side of the 2-dimensional communication sheet 104 with respect to the shield board 106. Moreover, the wireless IC tags 1022 and 1024 are formed slidably between the incommunicable area and the communicable area. For example, when the wireless IC tag 1022 is slid on the incommunicable area, the wireless IC tag 1024 is slid on the communicable area. Accordingly, it is desirable that a size of the communicable area (a length along which the operation part 108 is slid) is substantially the same as a length along which each wireless IC tag constituting the wireless IC tags 1022 and 1024. On the contrary, when the wireless IC tag 1024 is slid on the incommunicable area, the wireless IC tag 1022 is slid on the communicable area. The operation part 108 is formed on an opposite side of the shield board 106 with respect to the wireless IC tags 1022 and 1024.

In the switch device 100, by causing the operation part 108 to slide, the wireless IC tags 1022 and 1024 connected to the operation part 108 slide between the incommunicable area and the communicable area. By the wireless IC tags 1022 and 1024 sliding between the incommunicable area and the communicable area, when the wireless IC tag 1022 is located in the incommunicable area, electric power is supplied from the 2-dimensional communication sheet 104 to the wireless IC tag 1024, and the communication between the 2-dimensional communication sheet 104 and the wireless IC tag 1024 can be achieved.

On the other hand, when the wireless IC tag 1024 is located in the incommunicable area, electric power is supplied from the 2-dimensional communication sheet 104 to the wireless IC tag 1022, and the communication between the 2-dimensional communication sheet 104 and the wireless IC tag 1022 can be achieved. When the communication between the 2-dimensional communication sheet 104 and the wireless IC tag 1022 or the wireless IC tag 1024 can be achieved, the 2-dimensional communicable sheet 104 functions as a reader. In FIG. 4, because the wireless IC tag 1024 is in the incommunicable area and the wireless IC tag 1022 is located in the communicable area, the communication between the wireless IC tag 1022 and the 2-dimensional communication sheet 104 can be achieved. In FIG. 4, by sliding the operation part 108 to the left, the wireless IC tags 1022 and 1024 also slide to the left, and the shield board 106 is positioned between the wireless IC tag 1022 and the 2-dimensional communication sheet 104, and the wireless tag 1024 is in the communicable area, and, thereby the wireless communication between the wireless IC tag 1024 and the 2-dimensional communication sheet 104 can be achieved.

According to the present embodiment, a state where the wireless IC tag 1022 or 1024 is wireless communicable or a state where the wireless IC tag is not wireless communicable can be set by performing an operation to cause the operation part 108 to slide. The switch can be realized by having a function to set the state where the wireless IC tag 1022 is wireless communicable and the state where the wireless IC tag 1024 is wireless communicable to correspond to ON or OFF, and further detect the state where the wireless IC tag 1022 or 1024 is communicable or incommunicable in order to discriminate ON or OFF in accordance with the detection results.

Furthermore, the wireless IC tag is in a size as large as about several centimeters. Therefore, because it can switch ON or OFF by causing the operation part 108 to slide about several centimeters, the stroke can be shortened. The shape of the wireless IC tag 1022 or 1024 can be of a label type, a card type, a coin type, a stick type, etc., and any one can be used. Moreover, although the communicable distance may be about several millimeters to several meters, and can be selected in response to the size of the switch 100 if necessary.

<Variation (Part 1)>

Although the example in which the operation part 108 and the wireless IC tags 1022 and 1024 slide simultaneously in the above-mentioned embodiment, it is not limited to this example.

Figure 5:
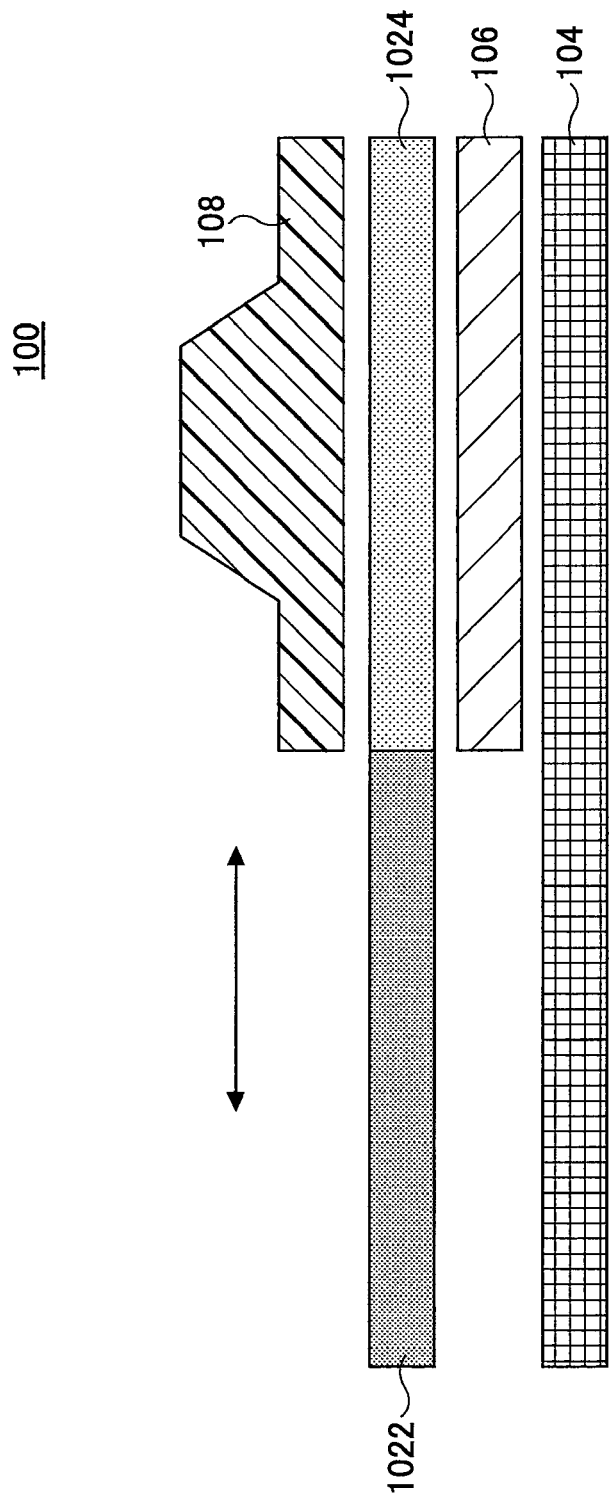
FIG. 5 is a structure diagram of an example of a switch device according to the embodiment.

FIG. 5 illustrates the switch device 100 according to the present variation.

The switch device 100 is configured to make the operation part 108 and the shield board 106 to slide simultaneously in the switch device that has been explained with reference to FIG. 4. A cross-sectional view of the switch device is illustrated in FIG. 5. Although it is illustrated in FIG. 5 that the 2-dimensional communication sheet 104 and the shield board 106 are separated from each other and the wireless IC tags 1022 and 1024 and the operation part 108 are separated from each other, they are in contact with each other. In FIG. 5, an arrow indicates a direction to slide the operation part 108. In FIG. 5, because the wireless IC tag 1022 is located on the communicable area, the wireless IC tag 1022 and the 2-dimensional communication sheet 104 are wireless communicable with each other. In FIG. 5, the communication between the wireless IC tag 1022 and the 2-dimensional communication sheet 104 is disabled by causing the operation part 108 to slide to the left because the shield board 106 also slides to the left to be located between the wireless IC tag 1022 and the 2-dimensional communication sheet 104. On the other hand, because the shield board 106, which has been located between the wireless IC tag 1024 and the 2-dimensional communication sheet 104, slides to the left, the wireless communication between the wireless IC tag 1024 and the 2-dimensional communication sheet 104 can be achieved.

According to the present variation, by performing the operation to cause the operation part 108 to slide, the shield board 106 slides, which enables to set the state where the wireless IC tag 1022 is communicable or the state where the wireless IC tag 1024 is communicable. The switch can be realized by having a function to set the state where the wireless IC tag 1022 is communicable and the state where the wireless IC tag 1024 is communicable to correspond to ON or OFF, and further detect the state where the wireless IC tag 1022 or 1024 is communicable or not communicable in order to discriminate ON or OFF in accordance with the detection results.

<Variation (Part 2)>

Although the example in which the operation part 108 and the wireless IC tags 1022 and 1024 slide simultaneously in the above-mentioned embodiment, it is not limited to this example.

Figure 6:
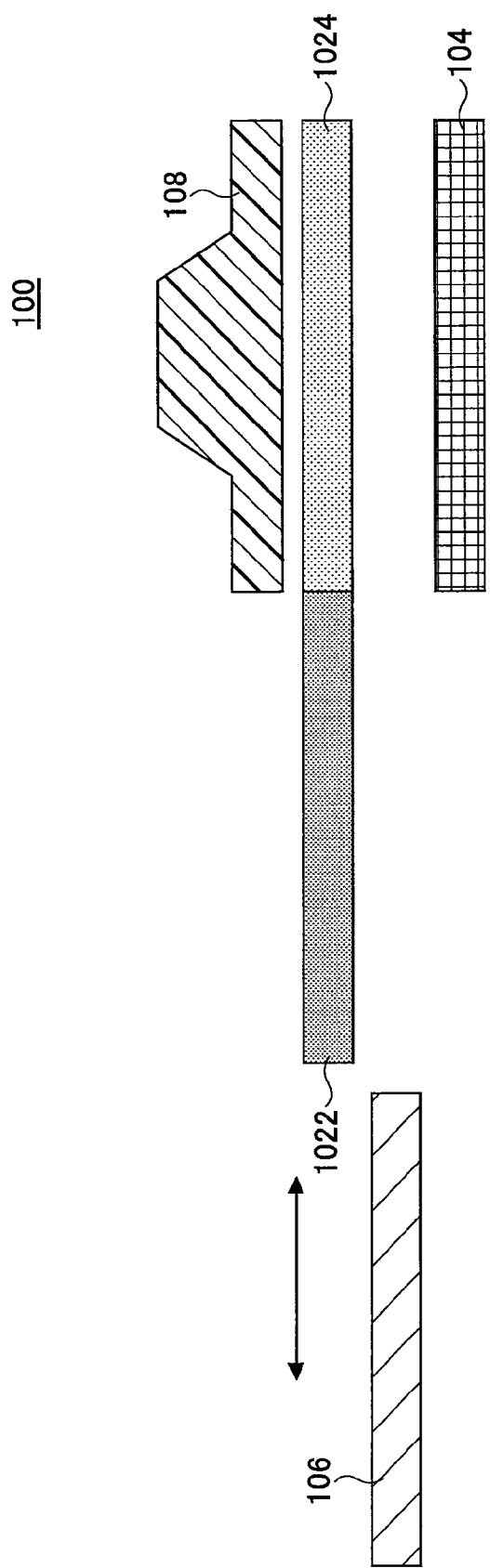
FIG. 6 is a structure diagram of an example of a switch device according to an embodiment.

FIG. 6 illustrates the switch device 100 according to the present variation.

The switch device 100 is configured to make the operation part 108 and the 2-dimensional communication sheet 104 to slide simultaneously in the switch device that has been explained with reference to FIG. 4. A cross-sectional view of the switch device is illustrated in FIG. 6. Although it is illustrated in FIG. 6 that the 2-dimensional communication sheet 104 and the shield board 106 are separated from each other and the wireless IC tags 1022 and 1024 and the operation part 108 are separated from each other, they are in contact with each other. In FIG. 6, an arrow indicates a direction to slide the operation part 108. In FIG. 6, by causing the operation part 108 to slide, the 2-dimensional communication sheet 104 also slides and oppose to the wireless IC tag 1022 or 1024. In the switch device 100, the shield board 106 is not formed between the wireless IC tags 1022 and 1024 and the 2-dimensional communication sheet 104 that slides together with the operation part 108. In FIG. 6, because the 2-dimensional communication sheet 104 and the wireless IC tag 1024 are opposite to each other, electric power is supplied from the 2-dimensional communication sheet 104 to the wireless IC tag 1024, which enables the wireless communication between the 2-dimensional communication sheet 104 and the wireless IC tag 1024. On the other hand, by causing the operation part 108 to slide to the left, the 2-dimensional communication sheet 104 also slides to the left and the 2-dimensional communication sheet 104 and the wireless IC tag 1022 are opposite to each other, and, thereby, electric power is supplied from the 2-dimensional communication sheet 104 to the wireless IC tag 1022, which enables the wireless communication between the 2-dimensional communication sheet 104 and the wireless IC tag 1022.

In the switch device 100, the shield board 106 is not always necessary.

According to the present variation, by performing the operation to cause the operation part 108 to slide, the 2-dimensional communication sheet 104 slides, which enables to set the state where the wireless IC tag 1022 is communicable and the state where the wireless IC tag 1024 is communicable. The switch can be realized by having a function to set the state where the wireless IC tag 1022 is communicable and the state where the wireless IC tag 1024 is communicable to correspond to ON or OFF, and further detect the state where the wireless IC tag 1022 or 1024 is communicable or not communicable in order to discriminate ON or OFF in accordance with the detection results.

<Third Embodiment>
<Switch Device>

Figure 7:
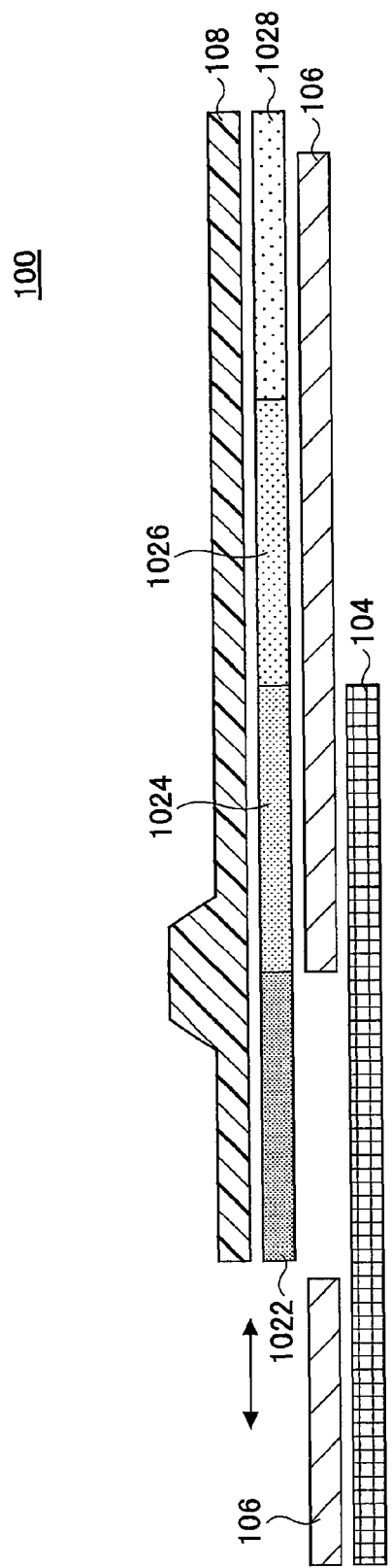
FIG. 7 is a structure diagram of an example of a switch device according to an embodiment.

FIG. 7 illustrates a switch device according to the present embodiment. The switch device applies a 2-dimensional communication technology. In this regard, it is the same as that of the embodiment mentioned above.

In the present embodiment, the same as the above-mentioned embodiment, a switch device that switches ON or OFF by a slide operation is illustrated as an example of a switch mechanism. Although mentioned later, it can be applied to a switch device having other mechanisms. Moreover, although a wireless IC tag is explained as an example of a sensor node in the present embodiment, it can be widely applied to IC chips that are wirelessly communicable.

The switch device 100 has wireless IC tags 1022, 1024, 1026 and 1028, the 2-dimensional communication sheet 104, the shield board 106, and the operation part 108. In FIG. 7, a cross-sectional view of the switch device is illustrated. Although it is illustrated that the 2-dimensional communication sheet 104 and the shield board 106 are separated from each other and the wireless IC tags 1022, 1024, 1026 and 1028 and the operation part 108 are separated from each other in FIG. 7, they are in contact with each other. In FIG. 7, an arrow indicates a direction of sliding the operation part 108.

The shield board 106 is formed in a part of a primary surface of the 2-dimensional communication sheet 104. The wireless IC tags 1022, 1024, 1026 and 1028 are formed adjacent to each other on an opposite side of the 2-dimensional communication sheet 104 with respect to the shield board 106. Moreover, the wireless IC tags 1022, 1024, 1026 and 1028 are formed slidably between the incommunicable area and the communicable area. For example, when the wireless IC tag 1022 is slid onto the communicable area, the other wireless IC tags 1024, 1026 and 1028 are slid onto the incommunicable area. Accordingly, it is desirable that a size of the communicable area (a length along which the operation part 108 is slid) is substantially the same as a length along which each wireless IC tag constituting the wireless IC tags 1022, 1024, 1026 and 1028. The operation part 108 is formed on the opposite side of the shield board 106 with respect to the wireless tags 1022, 1024, 1026 and 1028.

In the switch device 100, by causing the operation part 108 to slide, one of the wireless IC tags 1022, 1024, 1026 and 1028 connected to the operation part 108 slides to the communicable area and wireless IC tags other than the one wireless IC tag slide to the incommunicable area, and, thereby, electric power is supplied from the 2-dimensional communication sheet 104 to the one wireless IC tag, which enables the wireless communication between the 2-dimensional communication sheet 104 and the one wireless IC tag. When the wireless communication is enabled between the one wireless IC tag and the 2-dimensional communication sheet 104, the 2-dimensional communication sheet 104 functions as a reader. In FIG. 7, because the wireless IC tag 1022 is located on the communicable area and the wireless IC tags 1024, 1026 and 1028 are located on the incommunicable area, the communication between the wireless IC tag 1022 and the 2-dimensional communication sheet 104 can be achieved. In FIG. 7, by sliding the operation part 108 to the left, the wireless IC tags 1022, 1024, 1026 and 1028 also slide to the left, and the shield board 106 is positioned between the wireless IC tag 1022 and the 2-dimensional communication sheet 104, and the wireless tag 1024 is in the communicable area, and, thereby, the wireless communication between the wireless IC tag 1024 and the 2-dimensional communication sheet 104 can be achieved.

According to the present embodiment, a state where one of the wireless IC tags 1022, 1024, 1026 and 1028 is wirelessly communicable can be set by performing an operation to cause the operation part 108 to slide. The switch can be realized by having a function to set the state where the wireless IC tag 1022, 1024, 1036 or 1028 is communicable to correspond to a predetermined operation, and further detect the state where the wireless IC tag 1022, 1024, 1026 or 1028 is communicable and the predetermined operation is discriminated and set in accordance with the detection results. For example, it may be caused to correspond to a volume. When causing to correspond to the volume, each wireless IC tag may be caused to correspond to a volume label. When communication cannot be performed with all of the wireless IC tags 1022, 1024, 1026 and 1028 even if the operation part 108 is caused to slide, it can be judged that a malfunction occurs.

Furthermore, the wireless IC tag is in a size as large as about several centimeters. Therefore, because it can switch ON or OFF by causing the operation part 108 to slide about several centimeters, the stroke can be shortened. The shape of the wireless IC tag 1022, 1024, 1026 or 1028 can be of a label type, a card type, a coin type, a stick type, etc., and any one can be used. Moreover, although the communicable distance may be about several millimeters to several meters, and can be selected in response to the size of the switch 100 if necessary.

Although the switch device 100 having four wireless IC tags 1022, 1024, 1026 and 1028 has been explained in the present embodiment, the number of the wireless IC tags may be three or more than five.

Moreover, although the present embodiment has a structure in which one of the wireless IC tags 1022, 1024, 1026 and 1028 is slid so as to be located in the communicable area, it can be configured to form a plurality of communicable areas in accordance with a number of wireless IC tags so that the plurality of wireless IC tags and the 2-dimensional communication sheet can communicate wirelessly. In this case, it can function as a switch device by causing a combination of the wirelessly communicable wireless IC tags and a predetermined operation to correspond to each other. Additionally, depending on setting of the combination, a number of predetermined operations can be increased.

<Variation>

Figure 8:
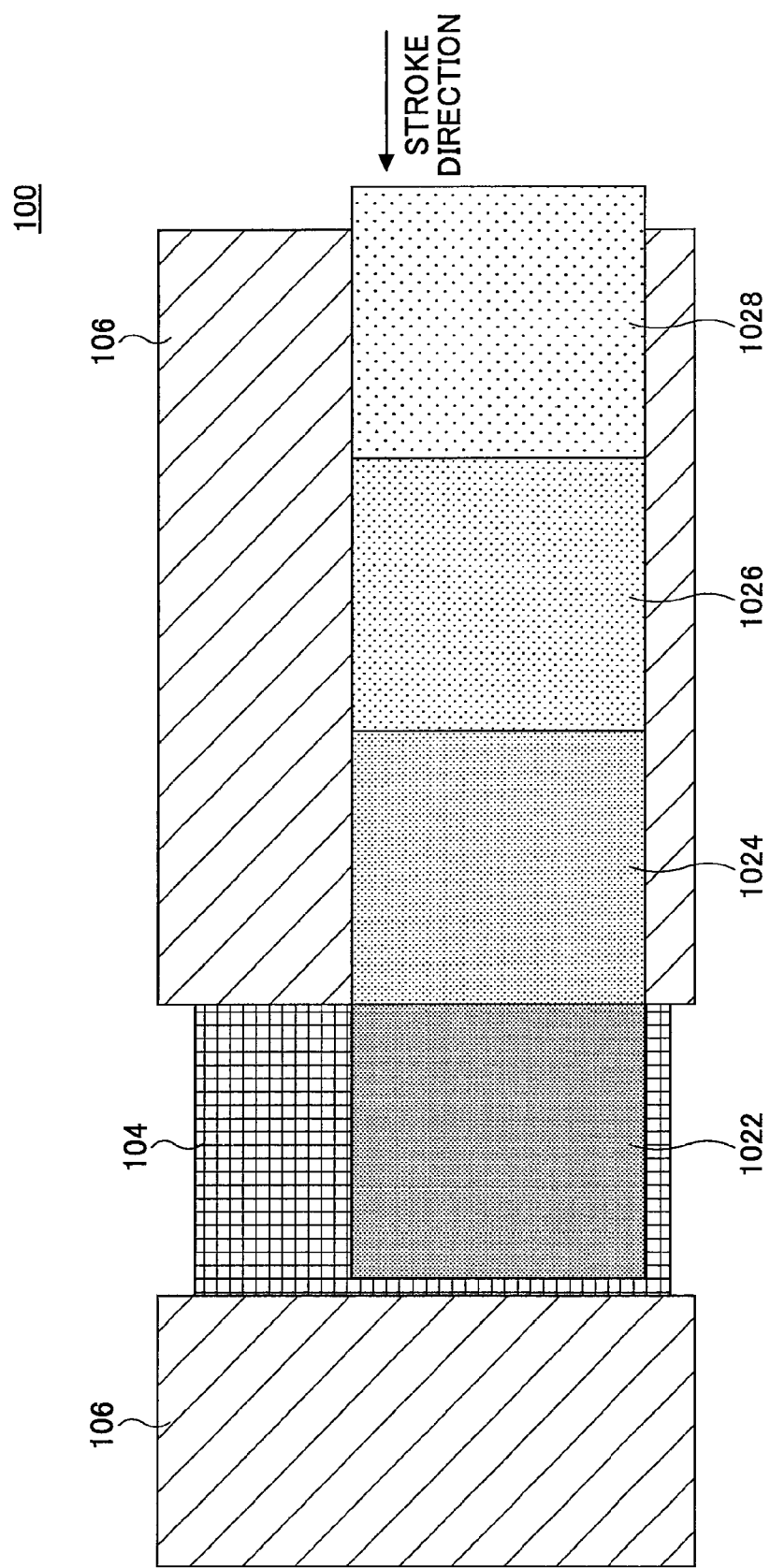
FIG. 8 is a structure diagram of an example of a switch device according to an embodiment.

FIG. 8 illustrates a structure when viewing the switch 100 illustrated in FIG. 7 from a direction of the operation part 108 (top surface). In FIG. 8, the operation part 108 is omitted.

According to FIG. 8, by causing the wireless IC tags to stroke in a stroke direction (leftward direction in FIG. 8), the wireless IC tag communicable with the 2-dimensional communication sheet 104 can be switched. The length of the stroke is equal to a length in a direction in which each wireless IC tag is caused to stroke.

In the present variation the length of the stroke is shortened further.

Figure 9:
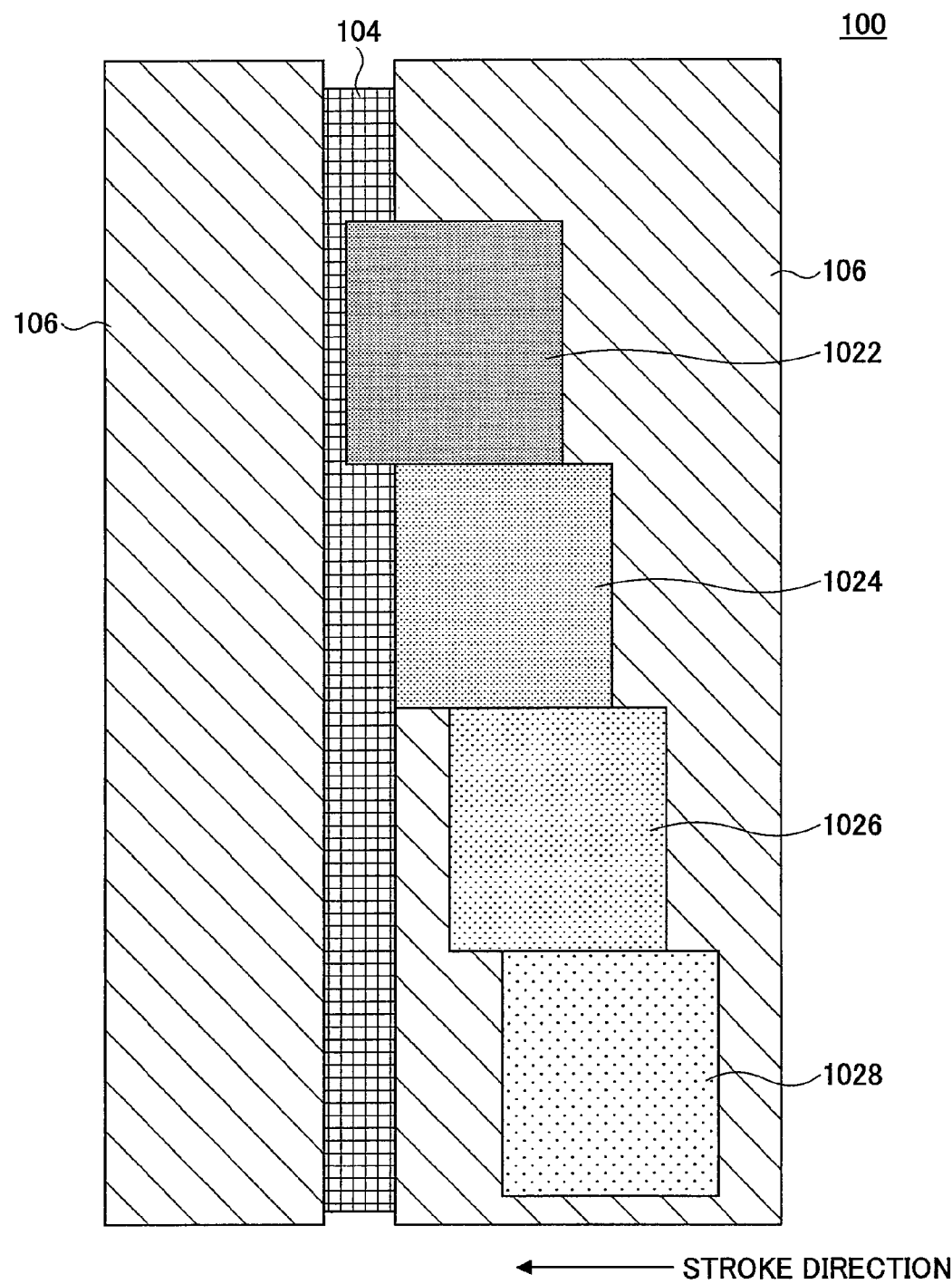
FIG. 9 is a structure diagram of an example of a switch device according to an embodiment.

FIG. 9 illustrates a structure when the switch device 100 according to the present variation is viewed from the direction of the operation part 108 (top surface). In FIG. 9, the operation part 108 is omitted.

According to FIG. 9, the wireless IC tags 1022, 1024, 1026 and 1028 are arranged in a direction perpendicular to the stroke direction. Further, the wireless IC tags 1022, 1024, 1026 and 1028 are arranged by shifting in the stroke direction by a predetermined interval. It is desirable to set the predetermined interval to a shortest length which enables the communication between the 2-dimensional communication sheet 104 and each wireless IC tag. By setting the predetermined interval to a shortest length which enables the communication between the 2-dimensional communication sheet 104 and each wireless IC tag, the wireless IC tag wirelessly communicable with the 2-dimensional communication sheet 104 can be switched with a shortest slide distance. For example, it may be ½ of the length in the stroke direction or may be ⅓.

According to the present variation, by causing the wireless IC tag to stroke in the stroke direction, the wireless IC tag communicable with the 2-dimensional communication sheet can be switched. Because the length of the stroke is less than the length in a direction to cause the wireless IC tag to stroke, the length to cause it to stroke can be shortened. Accordingly, the switch device 100 can be miniaturized.

Although the switch device 100 having four wireless IC tags 1022, 1024, 1026 and 1028 has been explained in the present variation, the number of the wireless IC tags may be three or more than five.

Moreover, although the present variation has a structure in which one of the wireless IC tags 1022, 1024, 1026 and 1028 is slid so as to be located in the communicable area, it can be configured to form a plurality of communicable areas in accordance with a number of wireless IC tags so that the plurality of wireless IC tags and the 2-dimensional communication sheet can communicate wirelessly. In this case, it can function as a switch device by having a function to cause a combination of the wirelessly communicable wireless IC tags and a predetermined operation to correspond to each other, further detect a state where the wireless IC tags 1022, 1024, 1026 and 1028 are communicable or not communicable, and determine a predetermined operation in accordance with a combination of the wireless IC tags that are wirelessly communicable in accordance with the detection results. Additionally, depending on setting of the combination, a number of predetermined operations can be increased.

<Fourth Embodiment>

<Switch Device>

Figure 10:
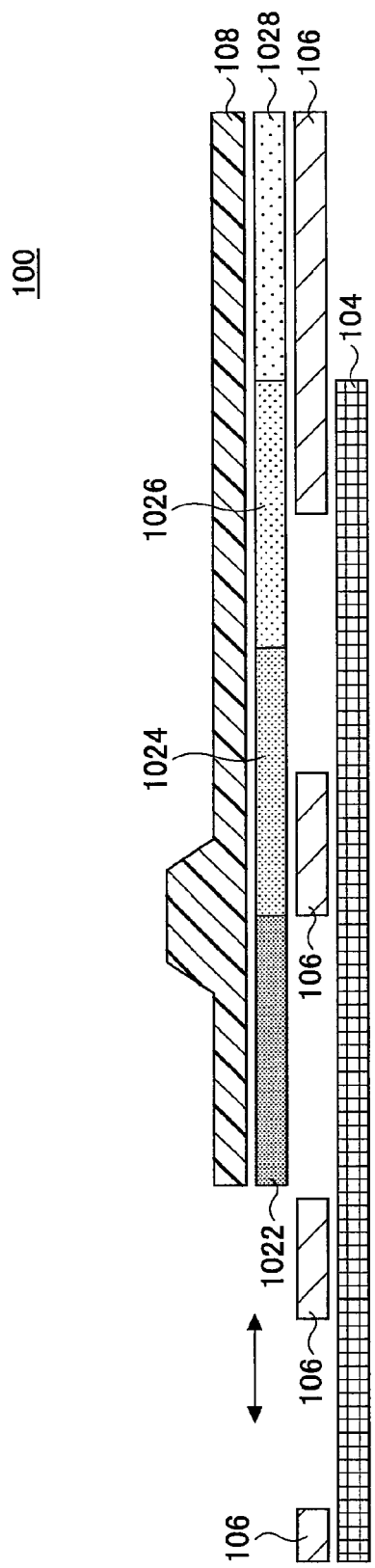
FIG. 10 is a structure diagram of an example of a switch device according to an embodiment.

FIG. 10 illustrates a switch device according to the present embodiment.

The switch device applies a 2-dimensional communication technology. In this regard, it is the same as that of the embodiment mentioned above.

In the present embodiment, the same as the above-mentioned embodiment, a switch device that switches ON or OFF by a slide operation is illustrated as an example of a switch mechanism. Although mentioned later, it can be applied to a switch device having other mechanisms. Moreover, although a wireless IC tag is explained as an example of a sensor node in the present embodiment, it can be widely applied to IC chips that are wirelessly communicable.

The switch device 100 has wireless IC tags 1022, 1024, 1026 and 1028, the 2-dimensional communication sheet 104, the shield board 106, and the operation part 108. In FIG. 10, a cross-sectional view of the switch device is illustrated. Although it is illustrated that the 2-dimensional communication sheet 104 and the shield board 106 are separated from each other and the wireless IC tags 1022, 1024, 1026 and 1028 and the operation part 108 are separated from each other in FIG. 10, they are in contact with each other. In FIG. 10, an arrow indicates a direction of sliding the operation part 108.

The shield board 106 is formed in a part of a primary surface of the 2-dimensional communication sheet 104. Hereinafter, an area in which the shield board 106 is formed on a primary surface of the 2-dimensional communication sheet 104 is referred to as "incommunicable area", and an area other than the "incommunicable area" is referred to as "communicable area". The wireless IC tags 1022, 1024, 1026 and 1028 are formed adjacent to each other on an opposite side of the 2-dimensional communication sheet 104 with respect to the shield board 106. Moreover, the wireless IC tags 1022, 1024, 1026 and 1028 are formed slidably between the incommunicable area and the communicable area. For example, when the wireless IC tag 1022 is slid onto the communicable area, the other wireless IC tags 1024, 1026 and 1028 are slid onto the incommunicable area. Accordingly, it is desirable that a size of the communicable area (a length along which the operation part 108 is slid) is substantially the same as a length along which each wireless IC tag constituting the wireless IC tags 1022, 1024, 1026 and 1028. Further, in the switch device 100, two communicable areas substantially the same as the direction to cause each wireless tag to slide are formed in the direction of causing the operation part 108 to slide at a predetermined interval. When one of the wireless IC tags is wirelessly communicable with the 2-dimensional communication sheet 104, the predetermined interval may be any interval if it is an interval at which other wireless IC tags are not wirelessly communicable. For example, the predetermined interval may be ⅓ of the length of the slide direction of the wireless IC tag, or may be ½. The operation part 108 is formed on an opposite side of the shield board 106 with respect to the wireless IC tags 1022, 1024, 1026 and 1028.

In the switch device 100, by causing the operation part 108 to slide, one of the wireless IC tags 1022, 1024, 1026 and 1028 connected to the operation part 108 slides onto the communicable area. Other wireless IC tags slide onto the incommunicable area. By sliding one of the wireless IC tags 1022, 1024, 1026 and 1028 connected to the operation part 108 onto the communicable area and sliding other wireless IC tags onto the incommunicable area, electric power is supplied from the 2-dimensional communication sheet 104 to the one wireless IC tag located on the communicable area, and wireless communication can be achieved between the one wireless IC tag and the 2-dimensional communication sheet 104. When the wireless communication is enabled between the one wireless IC tag and the 2-dimensional communication sheet 104, the 2-dimensional communication sheet 104 functions as a reader. Further, because two communicable areas are formed at a predetermined interval in a direction to cause the operation part 108 to slide, by causing the operation part 108 to slide by the predetermined interval, one of the wireless IC tags 1024, 1026 and 1028 slides into the communicable area.

In FIG. 10, because the wireless IC tag 1022 is located on the communicable area (hereinafter, referred to as "first communicable area"), and the wireless IC tags 1024, 1026 and 1028 are located on the incommunicable area, the wireless communication between the wireless IC tag 1022 and the 2-dimensional communication sheet 104 can be achieved. By causing the operation part 108 to slide to the left by the predetermined interval, the wireless IC tags 1022, 1024, 1026 and 1028 also slide to the left and the shield board 106 is arranged between the wireless IC tag 1022 and the 2-dimensional communication sheet 104, and the wireless IC tag 1026 is located on the communicable area (hereinafter, referred to as "second communicable area") different from the first communicable area, and, thereby, the wireless communication between the wireless IC tag 1026 and the 2-dimensional communication sheet 104 is enabled. Further, by causing the operation part 108 to slide to the left by the predetermined interval, the wireless IC tags 1022, 1024, 1026 and 1028 also slide to the left and the shield board 106 is arranged between the wireless IC tag 1026 and the 2-dimensional communication sheet 104, and the wireless IC tag 1024 is located on the first communicable area and, thereby, the wireless communication between the wireless IC tag 1024 and the 2-dimensional communication sheet 104 is enabled. Further, by causing the operation part 108 to slide to the left by the predetermined interval, the wireless IC tags 1022, 1024, 1026 and 1028 also slide to the left and the shield board 106 is arranged between the wireless IC tag 1024 and the 2-dimensional communication sheet 104, and the wireless IC tag 1028 is located on the second communicable area and, thereby, the wireless communication between the wireless IC tag 1028 and the 2-dimensional communication sheet 104 is enabled.

Although two communicable areas are illustrated in FIG. 10, three or more communicable areas may be provided. If three or more communicable areas area provided, it becomes a case where a plurality of wireless IC tags are communicable, and it can be operated as a switch by causing a combination of the plurality of wireless IC tags and a predetermined operation to correspond to each other.

According to the present embodiment, a state where one of the wireless IC tags 1022, 1024, 1026 and 1028 is wirelessly communicable can be set by performing an operation to cause the operation part 108 to slide. The switch can be realized by having a function to set the state where the wireless IC tag 1022, 1024, 1036 or 1028 is communicable to correspond to a predetermined operation, and further detect the state where the wireless IC tag 1022, 1024, 1026 or 1028 is communicable and discriminate and set the predetermined operation in accordance with the detection results. For example, it may be caused to correspond to a volume. When causing it to correspond to the volume, each wireless IC tag may be caused to correspond to a volume label. When communication cannot be performed with all of the wireless IC tags 1022, 1024, 1026 and 1028 even if the operation part 108 is caused to slide, it can be judged that a malfunction occurs.

Furthermore, the wireless IC tag is in a size as large as about several centimeters. Therefore, because it can switch ON or OFF by causing the operation part 108 to slide about several centimeters, the stroke can be shortened. Further, in the switch device, a plurality of communicable areas are formed at a predetermined interval, and the predetermined interval is a length less than the length in the direction of causing the wireless IC tag to slide and a switching operation can be made by sliding it by the predetermined interval, the stroke can be reduced further.

The shape of the wireless IC tag 1022, 1024, 1026 or 1028 can be of a label type, a card type, a coin type, a stick type, etc., and any one can be used. Moreover, although the communicable distance may be about several millimeters to several meters, and can be selected in response to the size of the switch 100 if necessary.

Although the switch device 100 having four wireless IC tags 1022, 1024, 1026 and 1028 has been explained in the present embodiment, the number of the wireless IC tags may be three or may be more than five.

Moreover, although the present embodiment has a structure in which one of the wireless IC tags 1022, 1024, 1026 and 1028 is slid so as to be located in the communicable area, it can be configured to form a plurality of communicable areas in accordance with a number of wireless IC tags so that the plurality of wireless IC tags and the 2-dimensional communication sheet can communicate wirelessly. In this case, it can function as a switch device by causing a combination of the wirelessly communicable wireless IC tags and a predetermined operation to correspond to each other. Additionally, depending on setting of the combination, a number of predetermined operations can be increased.

Additionally, as illustrated in the variation of the third embodiment, the wireless IC tags 1022, 1024, 1026 and 1028 may be arranged in a direction perpendicular to the stroke direction, and, further, the wireless IC tags 1022, 1024, 1026 and 1028 may be arranged in the stroke direction by shifting by a predetermined interval. By changing the arrangement of the wireless IC tags 1022, 1024, 1026 and 1028, the length of stroke can be shortened further.

<Fifth Embodiment>
<Switch Device>

Figure 11:
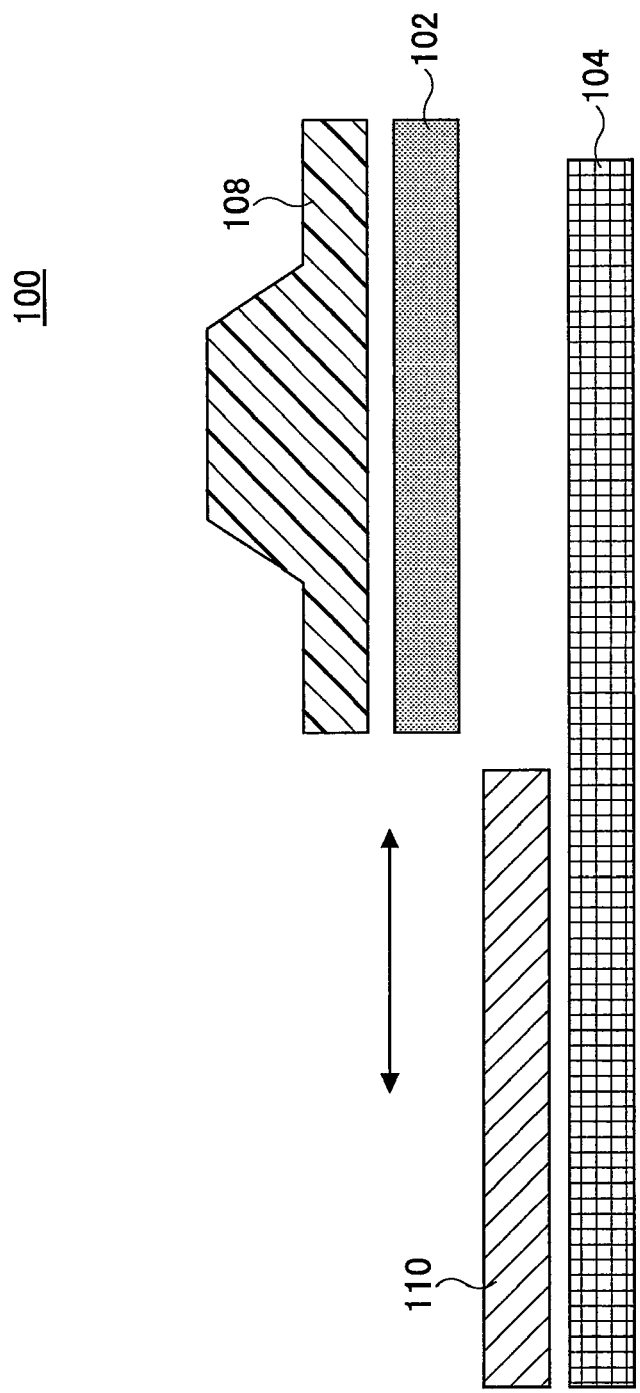
FIG. 11 is a structure diagram of an example of a switch device according to an embodiment.

FIG. 11 illustrates a switch device according to the present embodiment.

This switch device applies 2-dimensional communication technology. In this respect, it is the same as the above-mentioned embodiments.

In the present embodiment, the same as the above-mentioned embodiment, a switch device that switches ON or OFF by a slide operation is illustrated as an example of a switch mechanism. Although mentioned later, it can be applied to a switch device having other mechanisms. Moreover, although a wireless IC tag is explained as an example of a sensor node in the present embodiment, it can be widely applied to IC chips that are wirelessly communicable.

The switch device 100 has a shield board 110 which is different from the shield board 106 which the switch device according to the embodiments mentioned above has. A cross-sectional view of the switch device is illustrated in FIG. 11. Although it is illustrated that the 2-dimensional communication sheet 104 and the shield board 110 are separated from each other and the wireless IC tag 102 and the operation part 108 are separated from each other in FIG. 11, they are in contact with each other. In FIG. 11, an arrow indicates a direction of sliding the operation part 108.

The shield board 110 does not shield the power supply from the 2-dimensional communication sheet 104 to the wireless IC tag 102. In other words, when the shield board 110 is positioned between the 2-dimensional communication sheet 104 and the wireless IC tag 102, electric power is supplied from the 2-dimensional communication sheet 104 to the wireless IC tag 102. For example, the frequency used for power supply from the 2-dimensional communication sheet 104 to the wireless IC tag 102 is differentiated from the frequency used for communication between the 2-dimensional communication sheet 104 and the wireless IC tag 102. Then, the shield board 110 is configured to pass through only the frequency used for power supply from the 2-dimensional communication sheet 104 to the wireless IC tag. For example, the shield board 110 may be configured to pass through only the signal of the frequency used for power supply from the 2-dimensional communication sheet 104 to the wireless IC tag by making it in a mesh form, or may be configured to pass through only the signal of the frequency used for power supply from the 2-dimensional communication sheet 104 to the wireless IC tag by making it in a slit form. For example, the shield board 110 may be made configured by a filter that passes through a signal of a predetermined frequency. The shield board 110 is not limited to a board if it has a function to shield communication between the 2-dimensional communication sheet 104 and the wireless IC tag 102 and does not shield power supply from the 2-dimensional communication sheet 104 to the wireless IC tag 102.

If both the electromagnetic wave for power supply and communication wave are shielded by the shield board 110, when the wireless IC tag 102 and the 2-dimensional communication sheet 104 are not communicable, the wireless communication is performed between the wireless IC tag 102 and the 2-dimensional communication sheet 104 after the power supply from the 2-dimensional communication sheet 104 to the wireless IC tag 102 is performed. In a view point of performing a switching operation at further high-speed, it is desirable to perform power supply from the 2-dimensional communication sheet 104 to the wireless IC tag 102 even when wireless communication is not performed between the 2-dimensional communication sheet 104 and the wireless IC tag 102.

In the switch device 100, by causing the operation part 108 to slide between the incommunicable area and the communicable area, the wireless IC tag 102 connected to the operation part 108 also slides between the incommunicable area and the communicable area. By the wireless IC tag 102 sliding between the incommunicable area and the communicable area, when the wireless IC tag 102 is positioned on the incommunicable area, electric power is supplied from the 2-dimensional communication sheet 104, but the communication between the wireless IC tag 102 and the 2-dimensional communication sheet 104 cannot be performed. On the other hand, if the wireless IC tag 102 is positioned on the communicable area, electric power is supplied from the 2-dimensional communication sheet 104 to the wireless IC tag 102, and, further, the wireless communication between the wireless IC tag 102 and the 2-dimensional communication sheet 104 is enabled. In FIG. 11, because the wireless IC tag 102 is positioned on the communicable area, electric power is supplied from the 2-dimensional communication sheet 104 to the wireless IC tag 102, and, further, the wireless communication between the wireless IC tag 102 ad the 2-dimensional communication sheet 104 can be performed. In FIG. 11, by causing the operation part 108 to slide to the left, the wireless IC tag 102 also slides to the left, and if the shield board 110 is arranged between the wireless IC tag 102 and the 2-dimensional communication sheet 104, electric power is supplied from the 2-dimensional communication sheet 104 to the wireless IC tag 102, but the wireless communication between the wireless IC tag 102 and the 2-dimensional communication sheet 104 cannot be performed.

According to the present embodiment, a state where the wireless IC tag 102 is communicable or the state where it cannot communicable can be set by performing an operation to cause the operation part 108 to slide between the incommunicable area and the communicable area. The switch can be realized by having a function to set the state where the wireless IC tag 102 is communicable and the state where the wireless IC tag 102 is not communicable to correspond to ON or OFF, and further detect the state where the wireless IC tag 102 is communicable or the state where it is not communicable in order to discriminate ON or OFF in accordance with the detection results.

Further, because electric power is supplied even in the state where the wireless IC tag 102 cannot perform wireless communication, a speed of switching when it is changed from the state where the wireless communication cannot be performed into a state where wireless communication can be performed can be increased.

Furthermore, the wireless IC tag is in a size as large as about several centimeters. Therefore, because it can switch ON or OFF by causing the operation part 108 to slide about several centimeters, the stroke can be shortened. The shape of the wireless IC tag 102 can be of a label type, a card type, a coin type, a stick type, etc., and any one can be used. Moreover, although the communicable distance may be about several millimeters to several meters, and can be selected in response to the size of the switch 100 if necessary.

The switching operation can be at a further high-speed by applying the shield board 110 according to the present embodiment to the variations of the first embodiment, the second through fourth embodiments and the variations of the second embodiment.

<Sixth Embodiment>

In the above-mentioned embodiment, a switch device that switches ON or OFF by a slide operation has been explained as an example of a switch mechanism of a switch device. In the present embodiment, a switch device having other mechanisms will be explained.

The switch device explained in the present embodiment is an example, and the switch device can be realized by forming a structure in which a wireless IC tag and a 2-dimensional communication sheet are movable if a relative positional relationship is satisfied between the wireless IC tag and the 2-dimensional communication sheet. Further, if necessary, the switch can be realized by forming a structure in which a wireless IC tag and a 2-dimensional communication sheet are movable if a relative positional relationship including a shield board is satisfied.

Figure 12:
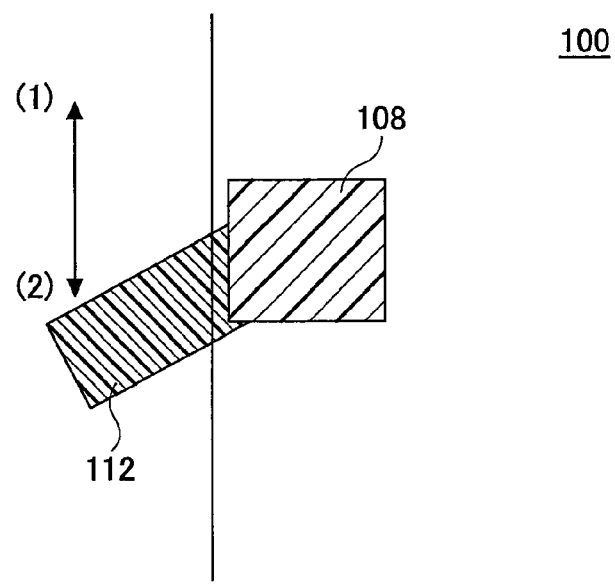
FIG. 12 is a structure diagram of an example of a switch device according to an embodiment.

FIG. 12 illustrates an example in which the switch device according to the above-mentioned embodiments is applied to a toggle switch.

With a toggle switch, an operation of "OFF" van be performed subsequently when it is set in "ON", and an operation of "ON" can be performed subsequently when it is set in "OFF". In other words, in the toggle switch, two kinds of commands can be switched alternately each time the same operation is performed. In FIG. 12, the wireless IC tag 102, the shield board 106 and the 2-dimensional communication sheet 104 are omitted. As the wireless IC tag 102, the shield board 106 and the 2-dimensional communication sheet 104, the structures indicated in the first embodiment, the second embodiment and the fifth embodiment may be applied.

A description will be given of a case where the switch device illustrated in FIG. 1 is applied. In the switch device 100 illustrated in FIG. 12, an operation lever 112 is attached to the operation part 108. The operation lever 112 and the operation part 108 may be unified. By switching the operation lever 112 between a first direction (1) and a second direction (2), the operation part 108 slides between the second direction (2) and the first direction (1). As an example, a description will be given of a case where the state illustrated in FIG. 12 corresponds to the state illustrated in FIG. 1. In this state, communication can be performed between the wireless IC tag 102 and the 2-dimensional communication sheet 104. By switching the operation lever 112 to the first direction, the operation part 108 slides to the second direction. By the operation part 108 sliding in the second direction, the operation part 108 of the switch device illustrated in FIG. 1 slides to the left side. By the operation part 108 sliding to the left side, the shield board 106 is located between the wireless IC tag 102 and the 2-dimensional communication sheet 104, and, thus, the wireless communication cannot be performed between the wireless IC tag 102 and the 2-dimensional communication sheet 104.

Further, by switching the operation lever 112 to the second direction, the operation part 108 slides in the first direction. By the operation part 108 sliding in the first direction, in the switch device illustrated in FIG. 1, the operation part 108 slides to the right side. By the operation part 108 sliding to the right side, the shield board 106 is not located between the wireless IC tag 102 and the 2-dimensional communication sheet 104, and, thus, the wireless communication can be performed between the wireless IC tag 102 and the 2-dimensional communication sheet 104.

<Seventh Embodiment>

The above-mentioned embodiments, a switch device that switches ON or OFF by a slide operation has been explained as an example of a switch mechanism of the switch mechanism. In the present embodiment, a switch device having other mechanisms is explained.

The switch device explained in the present embodiment is an example, and the switch device can be realized by forming a structure in which a wireless IC tag and a 2-dimensional communication sheet are movable if a relative positional relationship is satisfied between the wireless IC tag and the 2-dimensional communication sheet. Further, if necessary, the switch can be realized by forming a structure in which a wireless IC tag and a 2-dimensional communication sheet are movable if a relative positional relationship including a shield board is satisfied.

Figure 13:
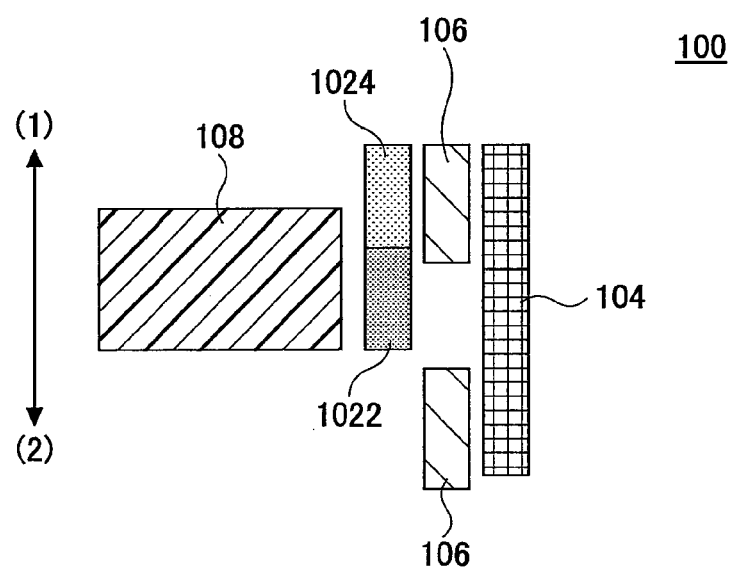
FIG. 13 is a structure diagram of an example of a switch device according to an embodiment.

FIG. 13 illustrates an example in which the switch device according to the above-mentioned embodiments is applied to a push switch.

With a push switch, ON or OFF operation can be performed by pushing the operation part 108. As the switch device 100, the structure indicated in the first embodiment, the second embodiment and the fifth embodiment is applicable.

As an example, a description will be given of a case where the switch device illustrated in FIG. 4 is applied. In the switch device 100 illustrated in FIG. 13, the operation part 108 has a function of a push button in a push switch. The push button may be attached to the operation part 108. By pushing the operation part 108, the operation part 108 as a push button moves in the second direction (2). Further, by pulling the operation part 108, the operation part 108 moves in the first direction (1). Moreover, it may have a mechanism in which, in a state where the operation part 108 has been moved in the second direction (2), the operation part 108 further moves in the first direction (1) by pushing the operation part 108.

By pushing or pulling the operation part 108, the operation part 108 is switched between the second direction (2) and the first direction (1). Because the operation part 108 is switched between the second direction (2) and the first direction (1), the wireless IC tags 1022 and 1024 connected to the operation part 108 slide between the second direction and the first direction. For example, a structure may be taken in which the operation part is caused to protrude from a side surface of the apparatus.

As an example, a description will be given in a case where the state illustrated in FIG. 13 corresponds to the state illustrated in FIG. 4. In this state, communication can be performed between the wireless IC tag 1022 and the 2-dimensional communication sheet 104. By switching (causing to slide) the operation part 108 in the second direction by pushing the operation part 108, the wireless IC tags 1022 and 1024 connected to the operation part 108 slide in the second direction. By the wireless IC tags 1022 and 1024 sliding in the second direction, in the switch device illustrated in FIG. 4, the operation part 108 slides to the left side. By the operation part 108 sliding to the left side, the shield board 106 is located between the wireless IC tag 1022 and the 2-dimensional communication sheet 104, and, thus, the communication cannot be performed between the wireless IC tag 1022 and the 2-dimensional communication sheet 104. On the other hand, because the shield board 106 is not located between the wireless IC tag 1024 and the 2-dimensional communication sheet 104, the communication can be performed between the wireless IC tag 1024 and the 2-dimensional communication sheet 104.

Further, by switching (causing to slide) the operation part 108 in the first direction by pulling the operation part 108, the wireless IC tags 1022 and 1024 connected to the operation part 108 slide in the first direction. By the wireless IC tags 1022 and 1024 sliding in the first direction, in the switch device illustrated in FIG. 4, the operation part 108 slides to the right side. By the operation part 108 sliding to the right side, the shield board 106 is located between the wireless IC tag 1024 and the 2-dimensional communication sheet 104, and, thus, the communication cannot be performed between the wireless IC tag 1024 and the 2-dimensional communication sheet 104. On the other hand, because the shield board 106 is not located between the wireless IC tag 1022 and the 2-dimensional communication sheet 104, the communication can be performed between the wireless IC tag 1022 and the 2-dimensional communication sheet 104.

<Variation (Part 1)>

Figure 14:
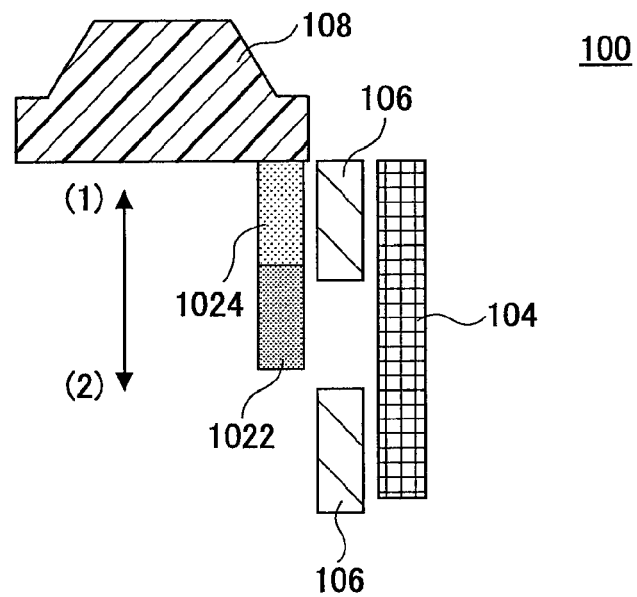
FIG. 14 is a structure diagram of an example of a switch device according to an embodiment.

FIG. 14 illustrates a switch device according to the present variation.

In the switch device 100, a connection position between the operation part 108 and the wireless IC tags 1022 and 1024 differs from the example illustrated in FIG. 13.

In the switch device 100 illustrated in FIG. 14, by switching the operation part 108 between the first direction (1) and the second direction (2), the wireless IC tags 1022 and 1024 connected to the operation part 108 slide between the first direction and the second direction. For example, a structure may be taken in which the operation part 108 is caused to protrude from a top surface of the device. As an example, a description will be given in a case where the state illustrated in FIG. 14 corresponds to the state illustrated in FIG. 4. In this state, communication can be performed between the wireless IC tag 1022 and the 2-dimensional communication sheet 104. By switching (pushing) the operation part 108 in the second direction, the wireless IC tags 1022 and 1024 connected to the operation part 108 slide in the second direction. By the wireless IC tags 1022 and 1024 sliding in the second direction, in the switch device illustrated in FIG. 4, the operation part 108 slides to the left side. By the operation part 108 sliding to the left side, the shield board 106 is located between the wireless IC tag 1022 and the 2-dimensional communication sheet 104, and, thus, the communication cannot be performed between the wireless IC tag 1022 and the 2-dimensional communication sheet 104. On the other hand, because the shield board 106 is not located between the wireless IC tag 1024 and the 2-dimensional communication sheet 104, the communication can be performed between the wireless IC tag 1024 and the 2-dimensional communication sheet 104.

Further, by switching (pulling) the operation part 108 in the first direction by pulling the operation part 108, the wireless IC tags 1022 and 1024 connected to the operation part 108 slide in the first direction. By the wireless IC tags 1022 and 1024 sliding in the first direction, in the switch device illustrated in FIG. 4, the operation part 108 slides to the right side. By the operation part 108 sliding to the right side, the shield board 106 is located between the wireless IC tag 1024 and the 2-dimensional communication sheet 104, and, thus, the communication cannot be performed between the wireless IC tag 1024 and the 2-dimensional communication sheet 104. On the other hand, because the shield board 106 is not located between the wireless IC tag 1022 and the 2-dimensional communication sheet 104, the communication can be performed between the wireless IC tag 1022 and the 2-dimensional communication sheet 104.

<Variation (Part 2)>

Figure 15:
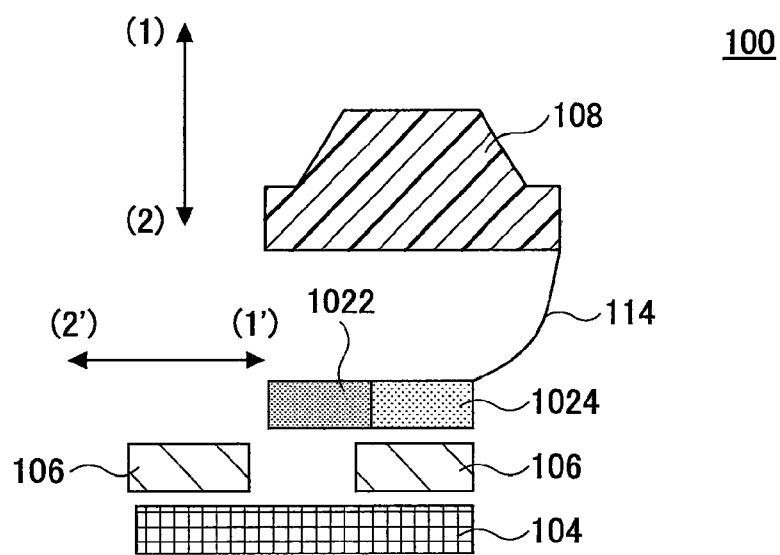
FIG. 15 is a structure diagram of an example of a switch device according to an embodiment.

FIG. 15 illustrates a switch device according to the present variation.

In the switch device 100, directions switched by the operation part 108 and slid directions between the wireless IC tags 1022 and 1024 differ from the example illustrated in FIG. 13.

The switch 100 illustrated in FIG. 15 has a direction change mechanism 114 between the operation part 108 and the wireless IC tags 1022 and 1024. The direction change mechanism 114 is a mechanism to change the direction of a force applied to the operation part 108 into a different direction. For example, in the example of FIG. 15, in a case where the operation part 108 is switches between the first direction (1) and the second direction (2), the wireless IC tags 1022 and 1024 are switched between the first dash direction (1') and the second dash direction (2') which are direction perpendicular to the first direction (1) and the second direction (2), respectively. For example, a structure can be taken in which the operation part 108 is caused to protrude from a top surface of the apparatus.

As an example, a description will be given in a case where the state illustrated in FIG. 15 corresponds to the state illustrated in FIG. 4. In this state, communication can be performed between the wireless IC tag 1022 and the 2-dimensional communication sheet 104. By switching (pushing) the operation part 108 in the second direction, the wireless IC tags 1022 and 1024 connected to the operation part 108 slide in the second dash direction. By the wireless IC tags 1022 and 1024 sliding in the second dash direction, in the switch device illustrated in FIG. 4, the operation part 108 slides to the left side. By the operation part 108 sliding to the left side, the shield board 106 is located between the wireless IC tag 1022 and the 2-dimensional communication sheet 104, and, thus, the communication cannot be performed between the wireless IC tag 1022 and the 2-dimensional communication sheet 104. On the other hand, because the shield board 106 is not located between the wireless IC tag 1024 and the 2-dimensional communication sheet 104, the communication can be performed between the wireless IC tag 1024 and the 2-dimensional communication sheet 104.

Further, by switching (pulling) the operation part 108 in the first direction by pulling the operation part 108, the wireless IC tags 1022 and 1024 connected to the operation part 108 slide in the first dash direction. By the wireless IC tags 1022 and 1024 sliding in the first dash direction, in the switch device illustrated in FIG. 4, the operation part 108 slides to the right side. By the operation part 108 sliding to the right side, the shield board 106 is located between the wireless IC tag 1024 and the 2-dimensional communication sheet 104, and, thus, the communication cannot be performed between the wireless IC tag 1024 and the 2-dimensional communication sheet 104. On the other hand, because the shield board 106 is not located between the wireless IC tag 1022 and the 2-dimensional communication sheet 104, the communication can be performed between the wireless IC tag 1022 and the 2-dimensional communication sheet 104.

<Application Example (Part 1)>

A description will be given of an application example of the above-mentioned switch 100.

The switch device 100 is applicable to all devices. For example, it is applicable to a device which has a function to switch ON or OFF, a device which switches control stepwisely, and a device which switches a plurality of processes. As an example, a description will be given of a case in which it is applied to a microwave oven.

Figure 16:
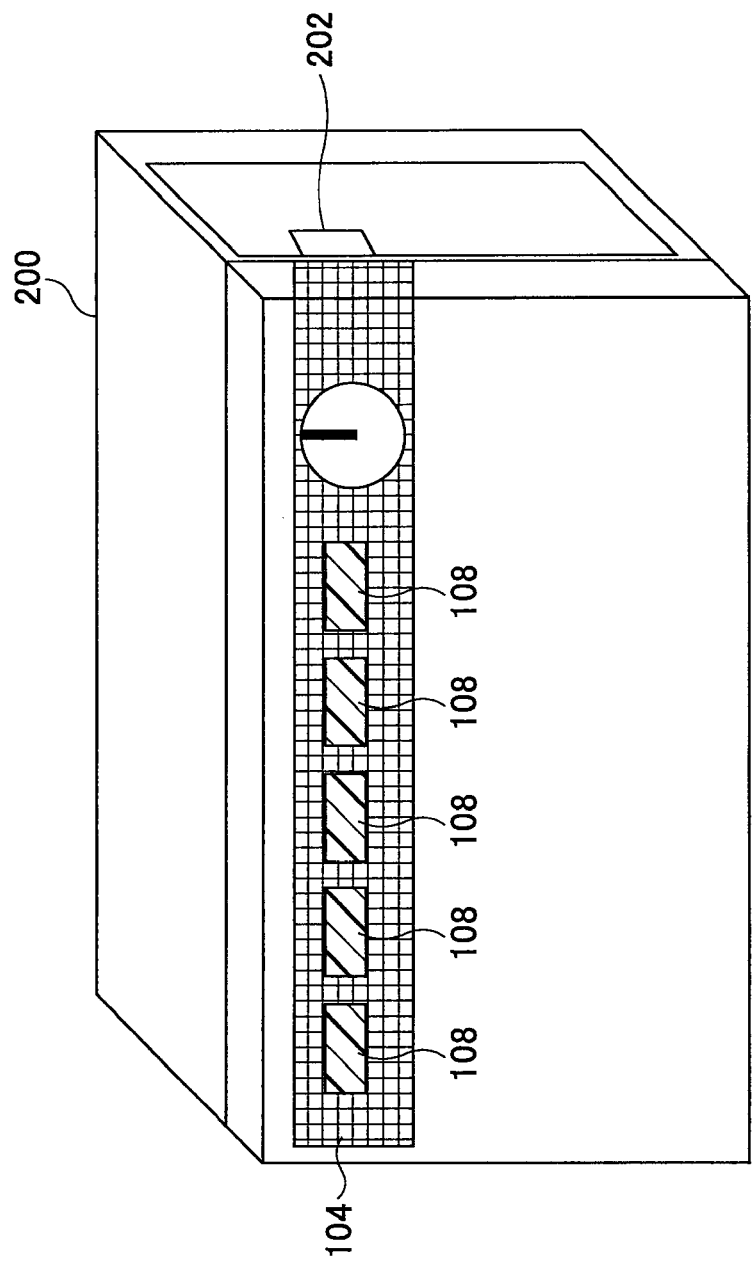
FIG. 16 is a structure diagram of an application example of a switch device according to an embodiment.

FIG. 16 illustrates an application example of the switch device 100. In FIG. 16, as an example, five switch devices are arranged side by side. Each of the five switches may be any one of switch devices according to the above-mentioned embodiments. The wireless IC tags included in the five switch devices have unique ID information. In other words, the ID information which each wireless IC tag possesses is different. For the sake of convenience of explanation, the operation part 108 and the 2-dimensional communication sheet 104, which are a part of the inner structure of the switch device, are illustrated in FIG. 16.

In the present device, the ID information of the wireless IC tag, which becomes communicable with the 2-dimensional sheet 104 as a result of an operation on the operation part 108, propagates the 2-dimensional communication sheet 104, and received by a 2-dimensional communication IC 202. The 2-dimensional communication IC performs a process corresponding to the ID information based on the received ID information of the wireless IC tag. A part of electric power to be supplied to the microwave oven is supplied to the 2-dimensional communication sheet 104.

<Application Example (Part 2)>

A description will be given of another application example the switch device 100 mentioned above.

Figure 17:
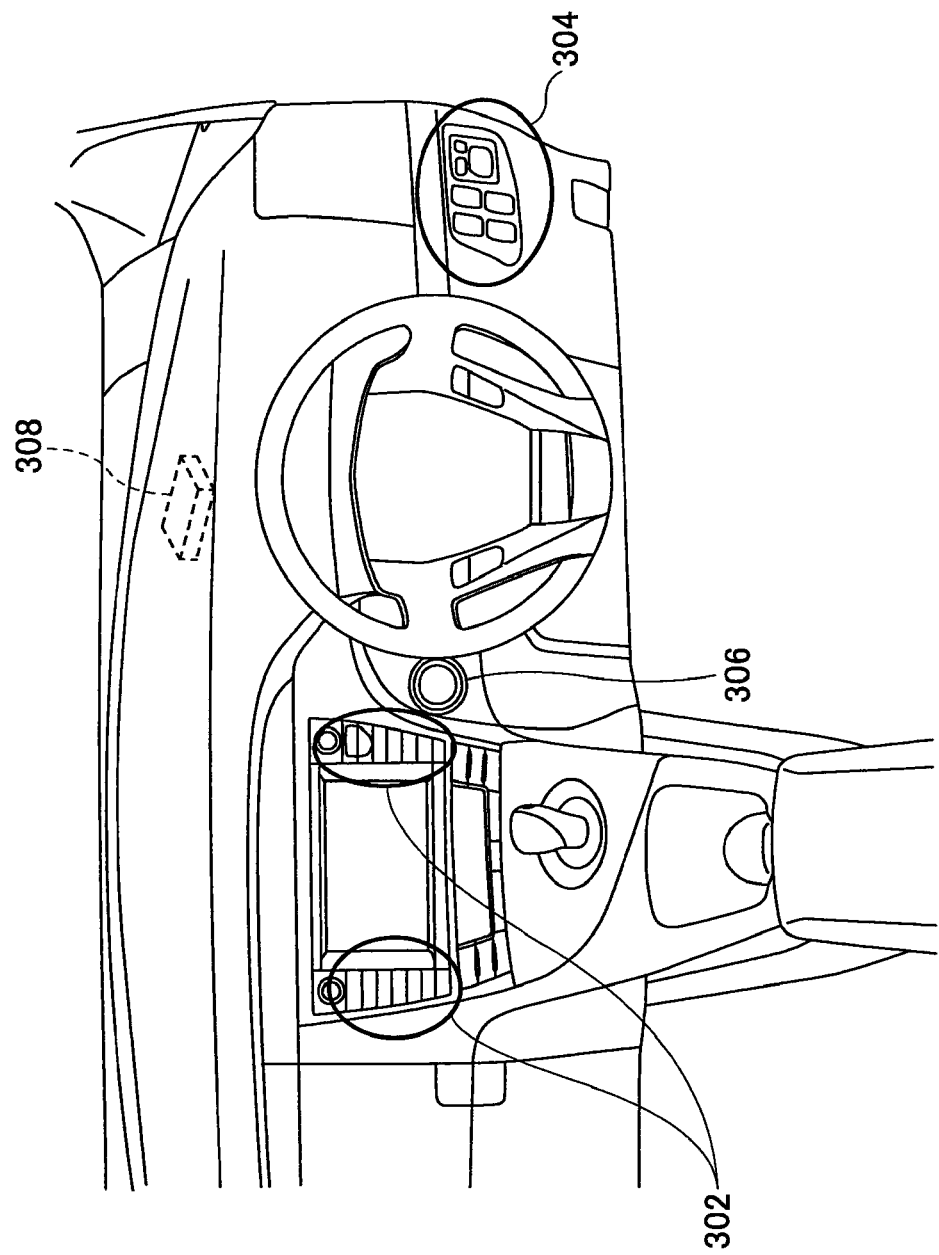
FIG. 17 is a structure diagram of an application example of a switch device according to an embodiment.

FIG. 17 illustrates an application example of the switch device 100. As an example, a description will be given of a case where it is applied to an electronic control unit (ECU: Electronic Control Unit) of switches in a periphery of an instrument panel of a vehicle.

In FIG. 17, switches 302, 304 and 306 are switches which appear on a surface of an instrument panel, and the switch 304 is, for example, a switch for turning on or off a light. For example, the switch devices indicated in the first and second embodiments are applicable to the switches 302 and 306. It is desirable that the switch for controlling a function regarding motion performance of the vehicle from among the switches 302 and 306 is constituted by a switch device which can perform a failure diagnosis. This is because, it is further desirable that a determination can be made whether it is a malfunction or not.

Any one of the switch devices mentioned above is applicable to the switch 304. In a case where the brightness of the light is multi-level adjustable, it is desirable to apply the switch devices indicated in the third and fourth embodiments.

The electronic control unit 308 receives a signal from each switch device. It is desirable that the electronic control unit 308 is adjacent to the instrument panel. By causing the electronic control unit 308 to be adjacent to the instrument panel, wiring between the electronic control unit and the switch device can be shortened. In each switch device, the electronic control unit 308 receives ID information from the wireless IC tag which has become communicable with the 2-dimensional communication sheet. The ID information propagates in the 2-dimensional communication sheet, and is received by the electronic control unit 308. In other words, an in-plane communication is performed. Additionally, the electronic control unit 308 supplies electric power to the 2-dimensional communication sheet. Using the electric power, the 2-dimensional communication sheet supplies electric power to the wireless IC tag.

Additionally, it is applicable to a switch of a side or a keyboard of a portable terminal device.

According to the present embodiments, switch devices are provided.

The switch device comprises:

a communication sheet that propagates electromagnetic wave;

a wireless communication part arranged close to said communication sheet, and stores predetermined information, and wirelessly transmits said predetermined information to the communication sheet;

a shield part that shields a radio signal wirelessly transmitted from said wireless communication part;

an operation part that enables or disables wireless communication between said communication sheet and said wireless communication part; and a discrimination part that discriminates contents of operation by said operation part based on the predetermined information wirelessly transmitted by said wireless communication part, wherein according to an operation by said operation part to disable the wireless communication between said communication sheet and said wireless communication part, said shield part shields the radio signal from said wireless communication part.

By causing the shield part to shield the radio signal from the wireless communication part to disable the wireless communication between the communication sheet and the wireless communication part, a length of a stroke can be shortened. Further, by making as a non-contact type, a contact failure can be eliminated.

Further, said wireless communication part is supplied with electric power through said communication sheet.

Because there is no need to equip a power supply in the wireless communication part by the wireless communication part being supplied with electric power through the communication sheet, a size of the wireless communication part can be reduced. Because the size of the wirell communication part can be reduced, a size of the switch device can also be reduced.

Further, said wireless communication part is supplied with electric power through said communication sheet; and said shield part does not shield the electric power supplied from said communication sheet to said wireless communication part.

Because the shield part does not shield electric power supplied from the communication sheet to the wireless communication part, even in a state where it cannot perform wireless communication with the communication sheet, the wireless communication part, which cannot perform wireless communication, is able to receive electric supply. Because wireless communication can be performed when the wireless communication is enabled without starting from power supply, a switching speed can be improved.

Another switch device comprises:

a communication sheet that propagates electromagnetic wave;

a plurality of wireless communication parts arranged close to said communication sheet, and stores predetermined information, and wirelessly transmits said predetermined information to the communication sheet;

a shield part that shields a radio signal wirelessly transmitted from said wireless communication parts;

an operation part that enables wireless communication between said communication sheet and any one of said plurality of wireless communication parts; and a discrimination part that discriminates contents of operation by said operation part based on the predetermined information wirelessly transmitted by said wireless communication parts, wherein each wireless communication part stores unique information; and according to an operation by said operation part to disable the wireless communication between said communication sheet and other wireless communication parts other than the wireless communication part that should be set to be wirelessly communicable, said shield part shields the radio signal from said other wireless communication parts.

By causing the shield part to shield the radio signal from other wireless communication part other than the wireless communication part to be wirelessly communicable with the communication sheet, and disabling the wireless communication between the communication sheet and other communication parts, the contents of operation is discriminated based on the predetermined information transmitted from one of the plurality of wireless communication parts. The contents of process can be changed by causing each wireless communication part to correspond to the contents of operation.

Further, said wireless communication parts are supplied with electric power through said communication sheet.

Because there is no need to equip a power supply in the wireless communication parts by the wireless communication parts being supplied with electric power through the communication sheet, a size of the wireless communication parts can be reduced. Because the size of the wireless communication parts can be reduced, a size of the switch device can also be reduced.

Further, said wireless communication parts are supplied with electric power through said communication sheet; and said shield part does not shield the electric power supplied from said communication sheet to said wireless communication parts.

Because the shield part does not shield electric power supplied from the communication sheet to the wireless communication parts, even in a state where it cannot perform wireless communication with the communication sheet, the wireless communication parts, which cannot perform wireless communication, are able to receive electric supply. Because wireless communication can be performed when the wireless communication is enabled without starting from power supply, a switching speed can be improved.

Another switch device comprises:

a communication sheet that propagates electromagnetic wave;

a plurality of wireless communication parts arranged close to said communication sheet, and stores predetermined information, and wirelessly transmits said predetermined information to the communication sheet;

a shield part that shields a radio signal wirelessly transmitted from said wireless communication parts;

an operation part that enables wireless communication between said communication sheet and at least one of said plurality of wireless communication parts; and a discrimination part that discriminates contents of operation by said operation part based on the predetermined information wirelessly transmitted by said wireless communication parts, wherein each wireless communication part stores unique information; and according to an operation by said operation part to disable the wireless communication between said communication sheet and other wireless communication parts other than the wireless communication part that should be set to be wirelessly communicable, said shield part shields the radio signal from said other wireless communication parts.

By causing the shield part to shield the radio signal from other wireless communication parts other than the wireless communication part to be wirelessly communicable with the communication sheet, and disabling the wireless communication between the communication sheet and other communication parts, the contents of operation is discriminated based on the predetermined information transmitted from at least one of the plurality of wireless communication parts. The process contents can be changed by causing the information transmitted from each wireless communication part to correspond to the contents of operation. A number of wireless communication parts that transmit information from the plurality of wireless communication part can be changed in accordance with contents of process requested.

Further, said discrimination part discriminates the contents of operation by said operation part based on a combination of information wirelessly transmitted by said one or plurality of wireless communication parts.

By causing a combination of the information transmitted from each wireless communication part to correspond to the contents of operation, the contents of process can be changed. Also a number of wireless communication part that transmit information form the plurality of wireless communication parts and the combination of information transmitted from the wireless communication parts are changed in accordance with the contents of process requested.

Further, said wireless communication parts are supplied with electric power through said communication sheet.

Because there is no need to equip a power supply in the wireless communication parts by the wireless communication parts being supplied with electric power through the communication sheet, a size of the wireless communication parts can be reduced. Because the size of the wireless communication parts can be reduced, a size of the switch device can also be reduced.

Further, said wireless communication parts are supplied with electric power through said communication sheet; and said shield part does not shield the electric power supplied from said communication sheet to said wireless communication parts.

Because the shield part does not shield electric power supplied from the communication sheet to the wireless communication parts, even in a state where it cannot perform wireless communication with the communication sheet, the wireless communication parts, which cannot perform wireless communication, are able to receive electric supply. Because wireless communication can be performed when the wireless communication is enabled without starting from power supply, a switching speed can be improved.

Another switch device comprises:

a communication sheet that propagates electromagnetic wave;

a wireless communication part arranged close to said communication sheet, and stores predetermined information, and wirelessly transmits said predetermined information to the communication sheet;

an operation part that enables or disables wireless communication between said communication sheet and said wireless communication part; and a discrimination part that discriminates contents of operation by said operation part based on the predetermined information wirelessly transmitted by said wireless communication part.

By enabling or disabling the wireless communication between said communication sheet and said wireless communication part by the operation part, a length of a stroke can be shortened in accordance with the size of the wireless communication part. Further, by making of a non-contact type, a contact failure can be eliminated.

Further, it has a shield part that shields a radio signal wirelessly transmitted from said wireless communication part, wherein according to an operation by said operation part to disable wireless communication between said communication sheet and said wireless communication part, said shield part shields the radio signal from said wireless communication part.

By causing the shield part to shield the radio signal from the wireless communication part to disable the wireless communication between the communication sheet and the wireless communication part, a length of a stroke can be shortened. Further, by making of a non-contact type, a contact failure can be eliminated.

Further, said wireless communication part is supplied with electric power through said communication sheet.

Because there is no need to equip a power supply in the wireless communication part by the wireless communication parts being supplied with electric power through the communication sheet, a size of the wireless communication part can be reduced. Because the size of the wireless communication part can be reduced, a size of the switch device can also be reduced.

Further, said wireless communication part is supplied with electric power through said communication sheet; and said shield part does not shield the electric power supplied from said communication sheet to said wireless communication part.

Because the shield part does not shield electric power supplied from the communication sheet to the wireless communication parts, even in a state where it cannot perform wireless communication with the communication sheet, the wireless communication part, which cannot perform wireless communication, is able to receive electric supply. Because wireless communication can be performed when the wireless communication is enabled without starting from power supply, a switching speed can be improved.

As mentioned above, although the present invention has been explained while referring to specific embodiments, each embodiment is mere an exemplary indication, and a person skilled in the art would understand various variations, modifications, substitutions, replacements, etc. For the sake of convenience of explanation, the devices according to the embodiments of the present invention are explained using functional block diagrams, however, such a device may be realized by hardware, software, or a combination of those. The present invention is not limited to the above-mentioned embodiments, and various variations, modifications, substitutions, replacements, etc., are included without departing from a scope of the present invention.

EXPLANATION OF REFERENCE NUMERALS

100 switch device
102, 1022, 1024, 1026, 1028 wireless IC tag
104 2-dimensional communication sheet
106, 110 shield board
108 operation part
112 operation lever
114 direction change mechanism
200 microwave oven
202 2-dimensional communication IC

The invention claimed is:

1. A switch device comprising:
   a communication sheet that propagates electromagnetic wave;
   a wireless communication part arranged close to said communication sheet, and stores predetermined information, and wirelessly transmits said predetermined information to the communication sheet;
   a shield part that shields a radio signal wirelessly transmitted from said wireless communication part;
   an operation part that enables or disables wireless communication between said communication sheet and said wireless communication part; and
   a discrimination part that discriminates contents of operation by said operation part based on the predetermined information wirelessly transmitted by said wireless communication part,
   wherein said shield part is arranged between said communication sheet and said wireless communication part; and
   according to an operation by said operation part to disable the wireless communication between said communication sheet and said wireless communication part, said shield part, said communication sheet or said wireless communication part slides and shields the radio signal from said wireless communication part,
   wherein said wireless communication part is supplied with electric power through said communication sheet,
   wherein said shield part does not shield the electric power supplied from said communication sheet to said wireless communication part, and
   wherein a frequency used for transmission of the electric power from the communication sheet to the wireless communication part is different from that used for transmission of a signal for the wireless communication, and the shield part is configured to pass only the frequency used for transmission of the electric power.

2. The switch device as claimed in claim 1, wherein said wireless communication part is supplied with electric power through said communication sheet.

3. The switch device as claimed in claim 1, wherein
   said wireless communication part is supplied with electric power through said communication sheet; and
   said shield part does not shield the electric power supplied from said communication sheet to said wireless communication part.

4. A switch device comprising:
   a communication sheet that propagates electromagnetic wave;
   a plurality of wireless communication parts arranged close to said communication sheet, and stores predetermined information, and wirelessly transmits said predetermined information to the communication sheet;
   a shield part that shields a radio signal wirelessly transmitted from said wireless communication parts;
   an operation part that enables wireless communication between said communication sheet and any one of said plurality of wireless communication parts; and
   a discrimination part that discriminates contents of operation by said operation part based on the predetermined information wirelessly transmitted by said wireless communication parts,
   wherein
   each wireless communication part stores unique information;
   said shield part is arranged between said communication sheet and said plurality of wireless communication parts; and
   according to an operation by said operation part to disable the wireless communication between said communication sheet and other wireless communication parts other than the wireless communication part that should be set to be wirelessly communicable, said shield part, said communication sheet or said wireless communication part slides and shields the radio signal from said other wireless communication parts,
   wherein said wireless communication part is supplied with electric power through said communication sheet,
   wherein said shield part does not shield the electric power supplied from said communication sheet to said wireless communication part, and
   wherein a frequency used for transmission of the electric power from the communication sheet to the wireless communication part is different from that used for transmission of a signal for the wireless communication, and the shield part is configured to pass only the frequency used for transmission of the electric power.

5. The switch device as claimed in claim 4, wherein said wireless communication parts are supplied with electric power through said communication sheet.

6. The switch device as claimed in claim 4, wherein
said wireless communication parts are supplied with electric power through said communication sheet; and
said shield part does not shield the electric power supplied from said communication sheet to said wireless communication parts.

7. A switch device comprising:
a communication sheet that propagates electromagnetic wave;
a plurality of wireless communication parts arranged close to said communication sheet, and stores predetermined information, and wirelessly transmits said predetermined information to the communication sheet;
a shield part that shields a radio signal wirelessly transmitted from said wireless communication parts;
an operation part that enables wireless communication between said communication sheet and at least one of said plurality of wireless communication parts; and
a discrimination part that discriminates contents of operation by said operation part based on the predetermined information wirelessly transmitted by said wireless communication parts,
wherein each wireless communication part stores unique information;
said shield part is arranged between said communication sheet and said plurality of wireless communication parts; and
according to an operation by said operation part to disable the wireless communication between said communication sheet and other wireless communication parts other than the wireless communication part that should be set to be wirelessly communicable, said shield part, said communication sheet or said wireless communication part slides and shields the radio signal from said other wireless communication parts,
wherein said wireless communication part is supplied with electric power through said communication sheet,
wherein said shield part does not shield the electric power supplied from said communication sheet to said wireless communication part, and
wherein a frequency used for transmission of the electric power from the communication sheet to the wireless communication part is different from that used for transmission of a signal for the wireless communication, and the shield part is configured to pass only the frequency used for transmission of the electric power.

8. The switch device as claimed in claim 7, wherein said discrimination part discriminates the contents of operation by said operation part based on a combination of information wirelessly transmitted by said one or plurality of wireless communication parts.

9. The switch device as claimed in claim 7, wherein said wireless communication parts are supplied with electric power through said communication sheet.

10. The switch device as claimed in claim 7, wherein
said wireless communication parts are supplied with electric power through said communication sheet; and
said shield part does not shield the electric power supplied from said communication sheet to said wireless communication parts.

* * * * *